(12) United States Patent
Sakimura et al.

(10) Patent No.: US 7,453,719 B2
(45) Date of Patent: Nov. 18, 2008

(54) MAGNETIC RANDOM ACCESS MEMORY WITH IMPROVED DATA READING METHOD

(75) Inventors: Noboru Sakimura, Tokyo (JP); Takeshi Honda, Tokyo (JP); Tadahiko Sugibayashi, Tokyo (JP)

(73) Assignee: NEC Corporation, Tokyo (JP)

( * ) Notice: Subject to any disclaimer, the term of this patent is extended or adjusted under 35 U.S.C. 154(b) by 397 days.

(21) Appl. No.: 10/553,998

(22) PCT Filed: Apr. 13, 2004

(86) PCT No.: PCT/JP2004/005242

§ 371 (c)(1),
(2), (4) Date: Oct. 21, 2005

(87) PCT Pub. No.: WO2004/095464

PCT Pub. Date: Nov. 4, 2004

(65) Prior Publication Data

US 2006/0227598 A1    Oct. 12, 2006

(30) Foreign Application Priority Data

Apr. 21, 2003  (JP) ............................. 2003-115283

(51) Int. Cl.
*G11C 11/15* (2006.01)
(52) U.S. Cl. .................................. 365/158; 365/189.07
(58) Field of Classification Search ..................... 365/33
See application file for complete search history.

(56) References Cited

U.S. PATENT DOCUMENTS

| 6,055,178 | A  | * | 4/2000 | Naji ............................. 365/158 |
| 6,392,923 | B1 |   | 5/2002 | Naji |
| 6,587,371 | B1 | * | 7/2003 | Hidaka ........................ 365/173 |
| 6,885,579 | B2 | * | 4/2005 | Sakimura et al. ............ 365/158 |

FOREIGN PATENT DOCUMENTS

| JP | 2001-325791 | 11/2001 |
| JP | 2002-222589 | 8/2002 |
| JP | 2002-533863 | 10/2002 |
| JP | 2002-367364 | 12/2002 |
| JP | 2002-541608 | 12/2002 |
| JP | 2003-060165 | 2/2003 |
| WO | WO 00/38192 | 6/2000 |

\* cited by examiner

*Primary Examiner*—Tan T. Nguyen
(74) *Attorney, Agent, or Firm*—Young & Thompson

(57) ABSTRACT

An MRAM has a plurality of bit lines, a reference bit line, a plurality of memory cells and reference cells and a read section. The memory cells are provided along the bit lines and the reference cells along the reference bit line. The memory cell and reference cell have a tunneling magnetic resistance and a reference tunneling magnetic resistance, each of which has a spontaneous magnetization whose direction is reversed in accordance with data stored therein. The read section has a first resistance section which contains a ninth terminal connected with a bit line and a tenth terminal connected with the first power supply, a second resistance section which contains an eleventh terminal connected with the reference bit line and a twelfth terminal connected with the first power supply, and a comparing section which compares a sense voltage on the ninth terminal and a reference voltage of the eleventh terminal.

36 Claims, 18 Drawing Sheets

MAGNETIC RANDOM ACCESS MEMORY WITH IMPROVED DATA READING METHOD

TECHNICAL FIELD

The present invention relates to a magnetic random access memory, particularly to a magnetic random access memory with a data reading method improved.

BACKGROUND ART

Attention is focused to a magnetic random access memory (MRAM) as a nonvolatile memory that can carry out a write operation and a read operation in a high speed and has a large number of times of rewrite.

A memory cell of the MRAM has a tunneling magnetic resistance (hereafter to be referred to as Tunneling Magnetic Resistance: TMR), which includes a magnetic layer (pinned layer), a magnetic layer (free layer), and an insulating layer, as a memory unit. The pinned layer has a fixed spontaneous magnetization. The free layer has a reversible spontaneous magnetization. The free layer is formed so that the direction of the spontaneous magnetization of the free layer becomes parallel or anti-parallel with the direction of the spontaneous magnetization of the pinned layer. The insulating layer is put between the above two layers.

The memory cell stores 1-bit data in accordance with the direction of the spontaneous magnetization of the free layer to the direction of the spontaneous magnetization of the pinned layer. For example, the memory cell can take the following two states: a parallel state (a first state) in which the direction of the spontaneous magnetization of the free layer and the direction of the spontaneous magnetization of the pinned layer, and an anti-parallel state (a second state) in which the direction of the spontaneous magnetization of the free layer and the direction of the spontaneous magnetization of the pinned layer are opposite to each other. In this case, the 1-bit data is stored by relating one of the parallel state and the anti-parallel state to "0" and the other of them to "1".

The directions of the spontaneous magnetizations of the free layer and pinned layer influence the resistance of the memory cell. Here, it is assumed that the resistance of the TMR when directions of the spontaneous magnetizations of the free layer and pinned layer are parallel is R0. In this case, if the directions are anti-parallel, the resistance of the TMR becomes R0+ΔR. The ΔR/R0 (%) is generally referred to as an MR ratio. The MR ratio normally ranges between 10 and 50%. That is, the data stored in the memory cell can be determined by detecting the resistance value the TMR corresponding to directions of the spontaneous magnetizations of the free layer and pinned layer. The resistance value of the TMR is detected in accordance with the following method. For example, a predetermined voltage is applied to the both ends of the TMR to detect current flowing through the TMR, i.e., sense current. Otherwise, a voltage appearing at the both ends of the TMR, i.e., a sense voltage is detected by supplying a predetermined current to the TMR.

FIG. 1 is a block diagram showing a typical configuration of an MRAM.

As shown in FIG. 1, a memory cell 103 is configured by connecting a TRM 109 with an access transistor 110 in series. One terminal of the TMR 109 is connected to a bit line 105a and the source terminal of the transistor 110 is connected to ground 111. A plurality of memory cells 103 are arrange like a matrix. Similarly, a reference memory cell 104 is configured by connecting a reference TMR 108 and an access transistor 112 in series. One terminal of the reference TMR 108 is connected to a reference bit line 105b and the source terminal of the transistor 112 is connected to the ground 113. A plurality of reference memory cells 104 are arranged along the reference bit line 105b. Moreover, the memory cells 103 arranged like a matrix and the reference memory cells 104 arranged along the reference bit line 105b form a memory cell array 120.

In this case, the transistor 110 of the selected memory cell 103 is turned-on. Moreover, the bit line 105a selected by a Y selector 102 is connected with a read circuit 101. The transistor 112 of the selected reference memory cell 104 is turned-on. Moreover, the bit line 105b selected by the selector 102 is connected with the read circuit 101. The read circuit 101 compares a signal from the selected bit line 105a with a signal from the selected reference bit line 105b to carry out a read operation.

A method for reading the data stored in a memory cell will be described in detail by using a first conventional example (U.S. Pat. No. 6,392,923). In this case, it is defined that a state in which a TMR is parallel is "0" (TMR resistance value is R0) and a state in which the TMR is anti-parallel is "1" (TMR resistance value is $R_1=R_0+\Delta R$).

FIG. 2 is a block diagram showing a configuration of a reference memory cell and its periphery. The data stored in the memory cell 103 is read out by detecting the previously described sense current or sense voltage by the read circuit. Moreover, a reference current or reference voltage for determining whether the sense current or sense voltage is kept at "0" or "1" is necessary. In case of the reference memory cell 104a shown in FIG. 2, two sets of one TMR storing "0" and one TMR storing "1" connected in series are connected in parallel in order to generate a reference signal. In this case, the reference value Rref of the reference cell is shown by the following equation (2).

$$Rref=(R_0+R_1)/2 \quad (2)$$

The resistance value of the reference memory cell 104a logically takes a value between R0 and R1. That is, it is possible to generate a reference signal suitable to determine the data stored in the memory cell 103.

FIG. 3 is a graph showing a relation of voltage (both-end voltage) applied between both ends of a TMR and MR ratio. The vertical axis denotes MR ratio (%) and the horizontal axis denotes both-end voltage (V) of TMR. The MR ratio of the TMR depends on magnitude of the both-end voltage (V) of the TMR in accordance with the influence of the bias dependency peculiar to the TMR element shown in FIG. 3.

With reference to FIG. 3, an actual reference signal becomes a value close to a sense signal of "1" in case of the method disclosed in the first conventional example. As shown in FIG. 3, the MR ratio of the TMR decreases as its both-end voltage rises. A voltage applied between the both ends of each TMR in the reference memory cell 104a in the above U.S. Pat. No. 6,392,923 (FIG. 2) is about ½ of the voltage applied between the both ends of the TMR of the memory cell 103. Therefore, as a result of comparison with the RM ratio of the TMR in the memory cell 103, the MR ratio of the TMR in the reference memory cell 104a increases. Thus, the reference signal is shifted in a direction of the sense signal of "1" from the intermediate value of the sense signal between "0" and "1". When the shit is present in the TMR resistance value, there is a possibility that the reliability in the read operation is greatly impaired. In this case, to improve the reliability in the read operation by the method according to the above first conventional example, it is necessary to carry out a control so as for voltages to be equally distributed to the both ends of TMRs in the memory cell 103 and reference memory cell 104*a*.

Also, in the method according to the above U.S. Pat. No. 6,392,923, four TMR elements are necessary for the reference memory cell 104*a*. When a resistance variation of a TMR is compensated by providing a column of reference memory cells in the memory cell array 120, the rate of the area occupied by the reference memory cells 104*a* increases. Moreover, when a short-circuited TMR produced due to a defect at the time of manufacturing is included in the reference memory cell 104*a*, a word line defect is caused that it is impossible to read the memory cells 103 on a read word line 107. A probability of the word line defect increases because of the fact that the reference memory cell 104*a* has the four TMRs. Moreover, the resistance value and MR ratio of a TMR are decreased due to a temperature rise.

A technique is demanded capable of determining a data stored in a memory cell of an MRAM in a high reliability. A technique is demanded of a read circuit capable of determining the data stored in the memory cell of the MRAM in the high reliability, while suppressing the increase of a chip area. A technique is demanded of the read circuit capable of determining the data stored in the memory cell of the MRAM in the high reliability without depending on a MR ratio and the resistance value of a TMR. A technique is demanded in which a reference signal in the memory cell of the MRAM takes an intermediate value between the sense signal of "0" and the sense signal of "1" without depending on the MR ratio and the resistance value of the TMR.

In conjunction with the above description, a semiconductor device is disclosed in Japanese Laid Open Patent Application (JP-P2002-222589A). This semiconductor device is provided with a plurality of first memory cells, a plurality of first dummy cells, and a plurality of second dummy cells. The plurality of first memory cells are provided at intersections of a plurality of word lines and a plurality of first data lines to store either of first data or second data. The plurality of first dummy cells is provided at intersections of the plurality of word lines and a plurality of first dummy data lines to store the first data. The plurality of second dummy cells are provided at intersections of the plurality of word lines and a plurality of second dummy data lines to store the second data. Moreover, the semiconductor device is further provided with a first multiplexer, a second multiplexer, a read circuit, a first common data line, and a second common data line. In this case, the fist multiplexer is connected to a plurality of first data lines. The second multiplexer is connected to the fist and second dummy data lines. The read circuit is connected to the first and second multiplexers. The first common data line connects the read circuit with the first multiplexer. The second common data line connects the read circuit with the second multiplexer. The read circuit includes a first current mirror circuit, a second current mirror circuit, a first sense data line, a second sense data line, and a sense amplifier. In this case, the first current mirror circuit is connected to the first common data line. The second current mirror circuit is connected to the second common data line. The first sense data line is connected to the first current mirror circuit. The second sense data line is connected to the second current mirror circuit. The sense amplifier is connected to the second sense data line.

Also, an evaluation apparatus for a cell resistance in a magnetic resistance memory is disclosed in Japanese Laid Open Patent application (JP-P2002-541608A) (International Application No. PCT/DE00/00778). In the evaluation apparatus for the cell resistance in the magnetic resistance memory, a first terminal of each cell resistance (R) is connected to a word line voltage (VWL) through a switch (US). Also, a second terminal of each cell resistance is connected to a line node (L) through another switch (S). The line node (L) is connected to a reference voltage source (VREF) through a reference resistance (RREF). The reference voltage source decreases each cell current (I) flowing through the line node by an average current (I−). Amplifiers (OPI, RG) convert the difference between the cell current and the average current into a voltage (VOUT) serving as an evaluation signal. The reference resistance (RREF) may be formed from interconnection of cell resistances of cells having different data. The reference resistance may have individual series connection of two cell resistances of cells having different data contents or parallel connection of the series connection.

Also, a magnetic random access memory having a reference memory array is disclosed in Japanese Laid Open Patent Application (JP-P2002-533863A) (International application No. PCT/US99/29310). The magnetic random access memory is provided with a first conductive line, a magnetic memory cell, a second conductive line, a reference magnetic memory cell, and a resistive element. The magnetic memory cell is connected with the first conductive line in series. The magnetic memory cell has a magnetic resistances switched between minimum magnetic resistance and maximum magnetic resistance in accordance with the direction of a stored magnetic vector. The reference magnetic memory cell is connected with the second conductive line in series, and has a predetermined magnetic resistance. The resistive element is connected with the reference magnetic memory cell in series. A total resistance of the reference magnetic memory cell and the resistive element is set between the minimum magnetic resistance and the maximum magnetic resistance. The resistive element may be set so that the total resistance takes an intermediate-point resistance between the minimum magnetic resistance and the maximum magnetic resistance.

In addition, a magnetic memory apparatus is disclosed in Japanese Laid Open Patent Application (JP-P2002-367364A). The magnetic memory apparatus has a memory cell, a word line, a bit line, a reference bit line, and an amplifier. The memory cell is provided with one memory element showing a ferromagnetic tunnel effect and one transistor connected to the memory element. The word line is connected to a control terminal of the transistor. The bit line is connected to one end of the memory element through the transistor. The reference bit line is provided in common to a plurality of the bit lines. The amplifier is connected to the bit lines and the reference bit line. Moreover, a voltage difference generated between the bit line and the reference bit line is read by the amplifier in a read operation of a data. A reference memory cell provided for each word line is provided for the reference bit line, and the reference memory cell includes one first resistive element and one transistor connected to the first resistive element. The first resistive element of the reference memory cell may have an intermediate value between a resistance value when the directions of magnetizations of the memory cell are parallel and a resistance value when the directions of magnetizations of the memory element are anti-parallel.

Furthermore, a magnetic random access memory is disclosed in Japanese Laid Open Patent Application (JP-P2002-196575A). This magnetic random access memory is provided with a cross-point cell array, a plurality of word lines extending in a first direction, a plurality of bit lines extending in a second direction different from the first direction, a dummy bit line extending in the second direction, a first selector for selecting one of the plurality of word lines, a second selector for selecting one of the plurality of bit lines, and a read circuit.

The plurality of word lines extend in a first direction. The plurality of bit lines extend in a second direction different from the first direction. The dummy bit line extends in the second direction. The first selector selects one of the plurality of word lines, and the second selector selects one of the plurality of bit lines. The cross-point cell array includes a plurality of cells. Each of the plurality of cells has reversible spontaneous magnetization and includes a tunneling magnetic resistance whose resistance differs in accordance with the direction of the spontaneous magnetization. The plurality of cells contains a plurality of memory cells for storing data in accordance with the direction of the spontaneous magnetization and a plurality of dummy cells. Each of the plurality of memory cells is provided between one of the plurality of word lines and one of the plurality of bit lines. Each of the plurality of dummy cells is provided between one word line of the plurality of word lines and the dummy bit line. The read circuit includes an offset removal circuit and a data determination circuit. The offset removal circuit generates a current difference signal corresponding to the difference between a detection current flowing through the selected word line when a voltage is applied between the selected word line and the selected bit line and an offset component current flowing through the dummy bit line when a voltage is applied between the selected word line and the dummy bit line. The data determination circuit determines the storage data stored in a selected cell provided between the selected word line and the selected bit line in accordance with the current difference signal.

DISCLOSURE OF INVENTION

Therefore, it is an object of the present invention to provide a magnetic random access memory (MRAM) that can determine a data stored in a memory cell of the MRAM at a high reliability.

Another object of the present invention is to provide a magnetic random access memory (MRAM) that can read out a data stored in a memory cell of the MRAM at a high reliability while restraining increase of a chip area.

Still another object of the present invention is to provide a magnetic random access memory (MRAM) that can read out a data stored in a memory cell of the MRAM at a high reliability without depending on a resistance value and MR ratio of a TMR.

It is another object of the present invention to provide a magnetic random access memory (MRAM) in which a reference signal for a memory cell of the MRAM takes an intermediate value between the sense signal of "0" and the sense signal of "1" without depending on MR ratio and a resistance value of a TMR.

Another object of the present invention is to provide a magnetic random access memory (MRAM) in which a voltage to be applied between the both ends of a TMR used in a reference cell and other circuits is substantially equal to a voltage to be applied between the both ends of a TMR used in a memory cell so that it is possible to prevent a read reliability from decreasing due to bias dependency peculiar to the TMR.

Therefore, to solve the above problems, the magnetic random access memory of the present invention is provided with a plurality of bit lines, a reference bit line, a plurality of memory cells, a plurality of reference cells, and a read section.

In this case, the plurality of bit lines extends in a first direction. The reference bit line extends in the first direction. The plurality of memory cells are provided along the bit lines. The plurality of reference cells are provided along the plurality of reference bit lines. Each of the plurality of memory cells has a first tunneling magnetic resistance. The first tunneling magnetic resistance has spontaneous magnetization whose direction is reversed in accordance with stored data to take a first state or a second state and is connected to one bit line in a read operation. Each of the plurality of reference cells has a reference tunneling magnetic resistance. The reference tunneling magnetic resistance has spontaneous magnetization whose direction is reversed in accordance with stored data to take the first state or the second state and is connected to one reference bit line in the read operation. The read section has a first resistance section, a second resistance section, and a comparing section. The first resistance section includes a ninth terminal serving as one terminal connected to the selected bit line in the read operation and a tenth terminal serving as the other terminal connected to a first power supply and has a first resistance value. The second resistance section includes an eleventh terminal serving as one terminal connected to a reference bit line in the read operation and a twelfth terminal serving as the other terminal connected to the first power supply and has a second resistance value different from the first resistance value. The comparing section compares a sense voltage serving as the voltage of the ninth terminal with a reference section serving as the section of the eleventh terminal.

In the above magnetic random access memory, when the data stored in a selected cell is read out, the read section first uses the voltage of the first power supply as a sense voltage by dividing the voltage of the first power supply by the first tunneling magnetic resistance and the first resistance section of the selected cell. On the other hand, a reference voltage is obtained by dividing the voltage of the first power supply by the reference tunneling magnetic resistance and the second resistance section of the selected reference cell. Moreover, a result of comparison between the sense voltage and the reference voltage is outputted. In this case, the selected cell is selected from the plurality of memory cells and the selected reference cell is selected from the plurality of reference cells.

In the above magnetic random access memory, the first resistance section has spontaneous magnetization whose direction is reversed to take the first state or the second state and has a second tunneling magnetic resistance and a third tunneling magnetic resistance connected in series. The second resistance section has spontaneous magnetization whose direction is reversed to take the first state or the second state and has a fourth tunneling magnetic resistance and a fifth tunneling magnetic resistance connected in series.

In the above magnetic random access memory, the reference tunneling magnetic resistance, the first tunneling magnetic resistance, the second tunneling magnetic resistance, the third tunneling magnetic resistance, the fourth tunneling magnetic resistance, and the fifth tunneling magnetic resistance substantially have the same structure. The second tunneling magnetic resistance and the third tunneling magnetic resistance are the same in magnetization direction of spontaneous magnetization. The fourth tunneling magnetic resistance and the fifth tunneling magnetic resistance are different in magnetization direction of spontaneous magnetization.

The above magnetic random access memory further includes a breakdown voltage preventing circuit connected between the ninth terminal and the plurality of memory cells to prevent a voltage higher than a predetermined reference voltage from being applied to the plurality of memory cells.

In the above magnetic random access memory, the read section further includes a first constant voltage section, a first current section, and a second current section. The first constant voltage section applies a second voltage between the ninth terminal and the plurality of memory cells and between the eleventh terminal and the plurality of reference cells. The first current section is set between the first constant voltage section and the ninth terminal to supply current having the same magnitude to the selected bit line and the first resistance section. The second current section is set between the first constant voltage section and the eleventh terminal to supply current having the same magnitude to the reference bit line and the second resistance section.

In the above magnetic random access memory, when the data stored in the selected cell is read out, the first constant voltage section of the read section first applies the second voltage to the selected bit line and reference bit line. The first current section supplies sense current having the same magnitude to the selected bit line, selected cell, and first resistance section. Similarly, the second current portion supplies reference currents having the same magnitude to the reference bit line, the selected reference cell, and the second resistance section. Moreover, the voltage between the first current section and the second resistance section is used as a sense voltage. Furthermore, the voltage between the second current section and the second resistance section is used as the reference voltage. Furthermore, a result of comparing the sense voltage with the reference voltage is output. In this case, the selected bit line is selected from the plurality of bit lines. The selected cell is selected from the plurality of memory cells. The selected reference cell is selected from the plurality of reference cells.

In the above magnetic random access memory, the first constant voltage section includes a clamp circuit.

In the above magnetic random access memory, at least one of the first current portion and the second current portion includes a current mirror circuit.

In the above magnetic random access memory, the read section further includes at least one of a first auxiliary section and a second auxiliary section. In this case, the first auxiliary section is connected to the ninth terminal and can change the sense voltage. The second auxiliary section is connected to the eleventh terminal and can change the reference voltage.

In the above magnetic random access memory, at least one of the first auxiliary section and the second auxiliary section includes a trimming circuit.

In the above magnetic random access memory, the plurality of reference cells further include a first switch connected to the reference tunneling magnetic resistance in series. The reference cells are connected in parallel with the reference bit line. Moreover, one of the plurality of reference cells is selected by the first switch as a selected reference cell used in the read operation.

In the above magnetic random access memory, there are a plurality of first resistance sections. Each of the plurality of first resistance sections is connected to the ninth and tenth terminals and has a second switch on either side of the ninth-terminal and the tenth-terminal. Moreover, one of the plurality of first resistance sections is selected by the second switch as the first resistance section used in the read operation.

In the above magnetic random access memory, there are a plurality of second resistance sections. Each of the plurality of second resistance sections is connected to the eleventh and twelfth terminals and has a third switch on either side of the eleventh-terminal and twelfth-terminal. One of the plurality of second resistance sections is selected by the third switch as the second resistance section used in the read operation.

In the above magnetic random access memory, assuming that a reference voltage is Vref, a sense voltage in the first state is Vs(1), and a sense voltage in the second state is Vs(2) in the following equation (1), the reference voltage Vref is obtained from the following equation (1).

$$Vref = Vs(1) + k \cdot (Vs(2) + Vs(1)) \quad (1)$$

In this case, a variable k is equal to or less than 0.49.

The above magnetic random access memory further includes a plurality of word line pairs, a first selector, a second selector, a third selector, and a fourth selector. The plurality of word line pairs are a set of plurality of first word lines and plurality of second word lines extending in the second direction substantially perpendicular to the first direction. The first selector selects a selected bit line from the plurality of bit lines in the read operation and selects a reference bit line. The second selector selects a selected bit line from the plurality of bit lines in the write operation. The third selector selects a selected first word line from the plurality of first word lines in the write operation. The fourth selector selects a second word line from the plurality of second word lines in the read operation. Each of the plurality of memory cells further includes a first transistor. The first transistor includes a first gate connected to the second word line, a first terminal serving as one of terminals other than the first gate, and a second terminal serving as the other terminal connected to ground. Each of the plurality of memory cells is provided to one of positions where the plurality of bit lines and the plurality of word line pairs are intersected. The first tunneling magnetic resistance includes a third terminal serving as one terminal connected to the first terminal and a fourth terminal serving as the other terminal connected to the bit line. Each of the plurality of reference cells further includes the second transistor. The second transistor includes a second gate connected to the second word line, a fifth terminal serving as one of terminals other than the second gate and a sixth terminal serving as the other terminal connected to ground. Each of the plurality of reference cells is provided to one of positions where the reference bit line and the plurality of word line pairs are intersected. A reference tunneling magnetic resistance includes a seventh terminal serving as one terminal connected to the fifth terminal and an eighth terminal serving as the other terminal connected to the reference bit line.

In the above magnetic random access memory, when the data stored in a selected cell is read out, the fourth selector first supplies a voltage for turning on the first transistor of the selected cell to a selected second word line and supplies a voltage for turning off the first transistors of unselected cells to unselected second word lines other than the selected second word line. The first selector connects the selected bit line and reference bit line to the read section. Moreover, the read section divides the voltage of the first power supply by the first tunneling magnetic resistance and the first resistance section of the selected cell as a sense voltage. The read section divides the voltage of the first power supply by the reference tunneling magnetic resistance of a selected reference cell and the second resistance section as a reference voltage. Moreover, the read section outputs a result of comparing the sense voltage with the reference voltage. In this case, the selected cell is selected from the plurality of memory cells by the selected second word line and the selected bit line. The unselected cells are memory cells other than the selected cell. A selected reference cell is selected from the plurality of reference cells by the selected second word line and the reference bit line.

The above magnetic random access memory further includes a word line, a first selector, and a second selector. The word line extends in the second direction substantially perpendicular to the first direction. The first selector selects a selected bit line from the plurality of bit lines and selects a reference bit line in the read operation. The second selector selects a selected word line from the plurality of word lines. Each of the plurality of memory cells is provided to one of positions where the plurality of bit lines and the plurality of word lines are intersected. The first tunneling magnetic resistance includes a first terminal serving as one terminal connected to the word line and the second terminal serving as the other terminal connected to the bit line. Each of the plurality of reference cells is provided to one of positions where the reference bit line and the plurality of word lines are intersected. The reference tunneling magnetic resistance includes the third terminal serving as one terminal connected to a word line and the fourth terminal serving as the other terminal connected to the reference bit line.

In the above magnetic random access memory, when the data stored in the selected cell is read out, the second selector first applies a read voltage to a selected word line and open unselected word lines other than a selected word line in the plurality of word lines. The first selector connects a selected bit line and a reference bit line to the read section. Moreover, the read section divides the voltage of the first power supply by the first tunneling magnetic resistance and the first resistance section of a selected cell as a sense voltage. The read section divides the voltage of the first power supply by the reference tunneling magnetic resistance and second resistance section of a selected reference cell as a reference voltage. The read section outputs a result of comparing the sense voltage with the reference voltage. In this case, the selected cell is selected from the plurality of memory cells by the selected word line and the selected bit line and the selected reference cell is selected from the plurality of reference cells by the selected word line and the reference bit line.

The above magnetic random access memory further includes the plurality of second bit lines, the plurality of word lines, the first selector, the second selector, and the third selector. The plurality of second bit lines is paired with the plurality of bit lines and extends in the second direction substantially perpendicular to the first direction. The plurality of word lines extend in the second direction substantially perpendicular to the first direction. The first selector selects the selected bit line from the plurality of bit lines. The second selector selects the selected second bit line from the plurality of second bit lines. The third selector selects a selected word line from the plurality of word lines. Each of the plurality of memory cells further includes the first transistor and the second transistor. The first transistor includes the first gate connected to the word line, the first terminal serving as one of terminals other than the first gate connected to the bit line, and the second terminal serving as the other terminal. The second transistor includes the second gate connected to the word line, the fifth terminal serving as one of terminals other than the second gate connected to a second bit line, and the sixth terminal serving as the other terminal connected to the second terminal. Each of the plurality of memory cells is provided to one of positions where the plurality of bit lines, the plurality of second bit lines, and the plurality of word lines are intersected. In the first tunneling magnetic resistance, the third terminal serving as one terminal is connected to ground and the fourth terminal serving as the other terminal is connected to the second terminal. Each of the plurality of reference cells further includes a third transistor and a fourth transistor. The third transistor includes a third gate connected to the word line, the seventh terminal serving as one of terminals other than the third gate connected to a bit line, and the eighth terminal serving as the other terminal. The fourth transistor includes a fourth gate connected to the word line, the eleventh terminal serving as one of terminals other than the fourth gate connected to the second bit line, and the twelfth terminal serving as the other terminal connected to the eighth terminal. Each of the plurality of reference cells is provided to one of positions where a reference bit line and the plurality of word lines are intersected. In the reference tunneling magnetic resistance, the ninth terminal serving as one terminal is connected to ground and the tenth terminal serving as the other terminal is connected to the eighth terminal.

In the above magnetic random access memory, when the data stored in a selected cell is read out, the first selector first selects a selected bit line and opens unselected bit lines other than a selected bit line from the plurality of bit lines. The third selector supplies a voltage for turning on the first transistor and the second transistor of a selected cell to the selected word line and supplies a voltage for turning off the first transistors and the second transistors of the unselected cells to the unselected word lines other than the selected word line. The read section divides the voltage of the first power supply by the first tunneling magnetic resistance and the first resistance section of the selected cell as a sense voltage. The read section divides the voltage of the first power supply by the reference tunneling magnetic resistance and the second resistance section of the selected reference cell as a reference voltage. Moreover, the read section outputs a result of comparing the sense voltage with the reference voltage. In this case, the selected cell is selected from the plurality of memory cells by the selected work line and the selected bit line. The unselected cells are memory cells other than the selected cell. The selected reference cell is selected from the plurality of reference cells by the selected word line and the reference bit line.

BEST MODE FOR CARRYING OUT THE INVENTION

Hereinafter, a magnetic random access memory of the present invention will be described in detail with reference to the attached drawings.

First embodiment

First, the configuration of the magnetic random access memory according to the first embodiment of the present invention will be described below.

Figure 4:
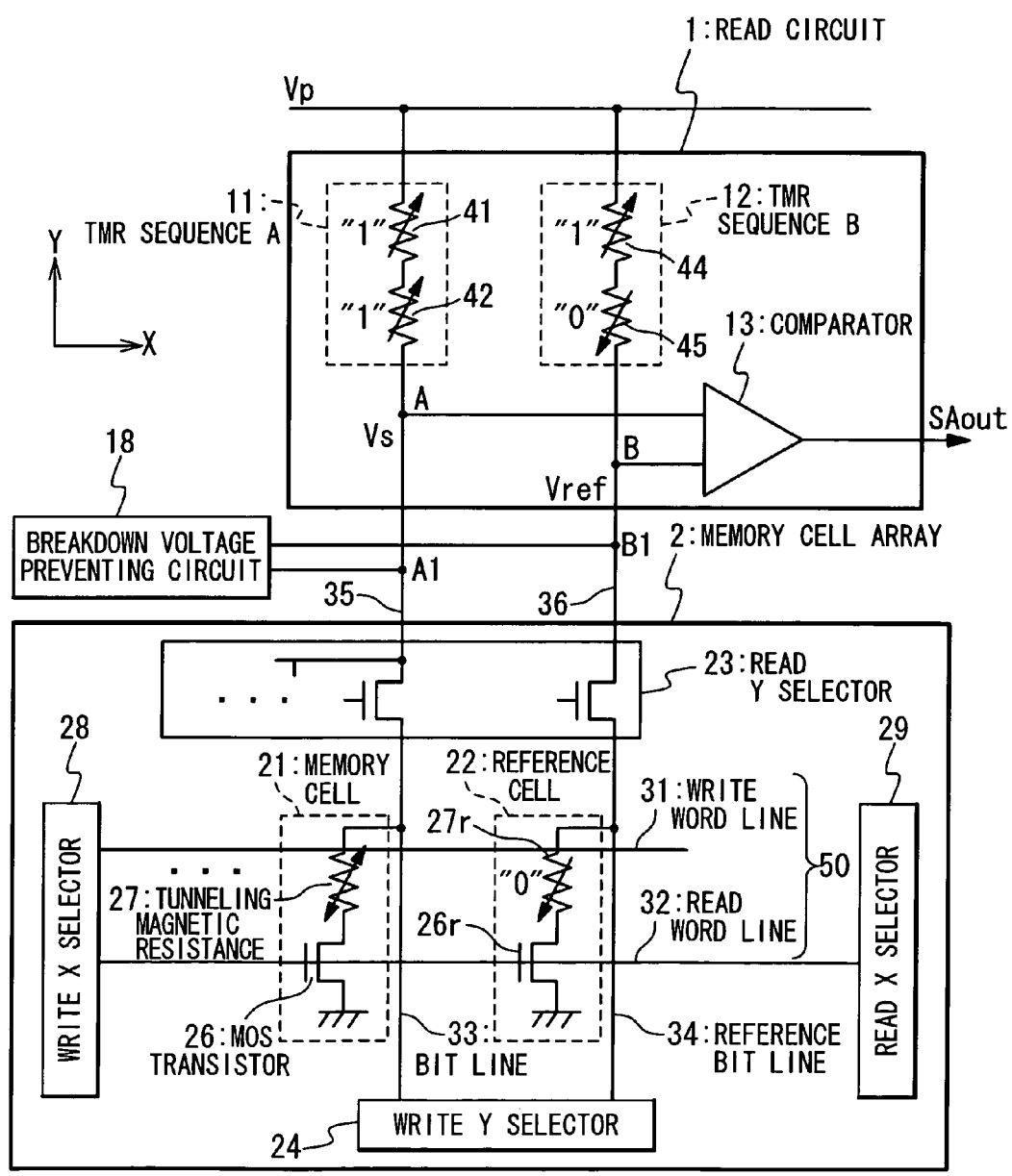
FIG. 4 is a block diagram showing a magnetic random access memory according to a first embodiment of the present invention.

FIG. 4 is a block diagram showing the magnetic random access memory according to the first embodiment of the present invention. The magnetic random access memory includes a read circuit 1, a memory cell array 2, and a breakdown voltage preventing circuit 18.

The memory cell array 2 stores data in a nonvolatile state by a memory cell 21 having a spontaneous magnetization whose direction can be freely reversed. The memory cell array 2 includes a plurality of memory cells 21, a plurality of reference cells (reference memory cells) 22, a plurality of bit lines 33, a reference bit line 34, a plurality of pairs of word lines 50, a read Y selector 23, a write Y selector 24, a write X selector 28, and a read X selector 29.

The bit lines 33 extend in Y direction as a first direction. One end of the bit line 33 is connected to the read Y selector 23 and the other end thereof is connected to the write Y selector 24. The plurality of bit lines 33 are arranged in parallel in X direction. The reference bit line 34 extends in the Y direction in parallel with the bit lines 33. One end of the reference bit line 34 is connected to the read Y selector 23 and the other end thereof is connected to the write Y selector 24. Each of the plurality of pairs of word lines 50 is a set of a write word line 31 serving as a first word line and a read word line 32 serving as a second word line. The plurality of pairs of word lines 50 extend in the X direction as the second direction substantially perpendicular to the first direction. One end of the write word line 31 is connected to the write X selector 28. One end of the read word line 32 is connected to the read X selector 29. The plurality of pairs of word lines 50 are arranged in parallel in the Y direction. The write Y selector 24 and the write X selector 28 are respectively connected to write power supplies (not shown).

The read Y selector 23 serving as a first selector selects one of the plurality of bit lines 33 as a selected bit line 33s in a read operation. Also, the read Y selector 23 selects the reference bit line 34. Thus, the read Y selector 23 outputs voltages or currents on the selected bit line 33s and the reference bit line 34 to the read circuit 1 through wirings 35 and 36. The write Y selector 24 serving as the second selector selects one of the plurality of bit lines 33 as a selected bit line 33s in a write operation. The write X selector 28 serving as a third selector selects one of the plurality of write word lines 31 as a selected write word line 31s in the write operation. The read X selector 29 serving as a fourth selector selects one of the plurality of read word lines 32 as a selected read word line 32s in the read operation.

The memory cells 21 are provided in positions where the plurality of bit lines 33 and the plurality of pairs of word lines 50 are intersected. That is, the memory cells 21 are provided along the plurality of bit lines 33. The memory cell 21 includes a tunneling magnetic resistance 27 and a MOS transistor 26.

The tunneling magnetic resistance 27 serving as a first tunneling magnetic resistance has a spontaneous magnetization whose direction is reversed in accordance with a data stored therein to take a first state or a second state. In this case, the first state is a case that a TMR is kept in an anti-parallel state and corresponds to the data of "1", and the second state is a case that the TMR is kept in a parallel state and corresponds to the data of "0". The tunneling magnetic resistance 27 is connected to a corresponding bit line 33 in the read operation. The tunneling magnetic resistance 27 includes a third terminal serving as one terminal and a fourth terminal serving as the other terminal connected to the bit lines 33. The MOS transistor 26 serving as a first transistor is used to connect the one terminal (third terminal) of the tunneling magnetic resistance 27 to ground in the read operation. The MOS transistor 26 has a first gate connected to the corresponding read word line 32, a first terminal serving as one of terminals other than the first gate, and a second terminal serving as the other terminal connected to ground. The first terminal is connected to the third terminal.

The plurality of reference cells 22 are provided in positions where the reference bit line 34 and the plurality of pairs of word lines 50 are intersected. That is, the reference cells 22 are provided along the reference bit line 34. A column of these reference cells 22 is also referred to as a reference cell column. The reference cell 22 includes a reference tunneling magnetic resistance 27r and a reference MOS transistor 26r.

The reference tunneling magnetic resistance 27r, has spontaneous magnetization whose direction is reversed in accordance with a data stored therein to take the first state or the second state. In this case, for reference in the read operation, the reference tunneling magnetic resistance 27r always stores the data of "0" when the TMR is in a second-state and is kept in a parallel state. Also, the reference tunneling magnetic resistance 27r is connected to the reference bit line 34 in the read operation. The reference tunneling magnetic resistance 27r has a seventh terminal serving as one terminal and an eighth terminal serving as the other terminal connected to the reference bit line 34. The reference MOS transistor 26r serving as a second transistor is used to connect one terminal (seventh terminal) of the reference tunneling magnetic resistance 27r to ground in the read operation. The reference MOS transistor 26r has a second gate connected to the read word line 32, a fifth terminal serving as one of terminals other than the second gate, and a sixth terminal serving as the other terminal connected to ground. The fifth terminal is connected to the seventh terminal.

The breakdown voltage preventing circuit 18 is connected to a node A1 in the middle of the wiring 35 extending from the read Y selector 23 of the memory cell array 2 and connected with the selected bit line 33. Similarly, the circuit 18 is connected to a node B1 in the middle of the wring 36 extending from the read Y selector 23 and connected with the reference bit line 34s. That is, the circuit 18 is connected between the read circuit 1 and the plurality of memory cells 21 or the plurality of reference cells 22. Also, the breakdown voltage preventing circuit 18 prevents a voltage higher than a predetermined voltage from being applied to the plurality of memory cells 21 or the plurality of reference cells 22. Thus, it is possible to prevent the voltage higher than the predetermined voltage from being applied to the memory cell array 2 from the read circuit 1.

The read circuit 1 serving as a read section outputs the data stored in a selected cell 21s in accordance with the voltages or currents supplied from the selected cell 21s and the selected reference cell 22s of the memory cell array 2. The selected cell 21s is the memory cell 21 specified by the selected read word line 32s and the selected bit line 33s. The selected reference cell 22s is the reference cell 22 specified by the selected read word line 32s and the selected bit line 34. The read circuit 1 includes a TMR sequence A 11 and TMR sequence B 12 used as load resistances and a comparator 13.

The TMR sequence A 11 serving as a first resistance section is used as the load resistance for the selected bit line 33s. The TMR sequence A 11 is provided with a (second) tunneling magnetic resistance 41 and a (third) tunneling magnetic resistance 42 which are connected in series and which have spontaneous magnetizations whose directions take the first state or the second state in a reversed state. Also, the TMR sequence A 11 has a ninth terminal (one end of tunneling magnetic resistance 42) serving as one end and a tenth terminal (one end of tunneling magnetic resistance 41) serving as the other terminal. The ninth terminal is connected to the memory cell array 2 and connected to the selected bit line 33s in the read operation. The tenth terminal is connected to a first power supply (Vp). In this case, the tunneling magnetic resistances 41 and 42 respectively store the data of "1" showing that TMRs are always kept in an anti-parallel state. A series resistance value of the tunneling magnetic resistances 41 and 42 is also referred to as a first resistance value.

The TMR sequence B 12 serving as a second resistance section is used as the load resistance for the reference bit line 34. The TMR sequence B 12 is provided with a (fourth) tunneling magnetic resistance 44 and a (fifth) tunneling magnetic resistance 45 which are connected in series, and which have spontaneous magnetizations whose directions take the first state or the second state in the reversed state. Also, the TMR sequence B 12 includes an eleventh terminal (one end of tunneling magnetic resistance 45) serving as one terminal and a twelfth terminal (one end of tunneling magnetic resistance 44) serving as the other terminal. The eleventh terminal is connected to the memory cell array 2 through the wiring 36 and connected to the reference bit line 34 in the read operation. The twelfth terminal is connected to the first power supply (Vp). In this case, one of the tunneling magnetic resistances 44 and 45 stores the data of "1" showing that the TMR is always kept in an anti-parallel state and the other of them stores the data of "0" showing that the TMR is always kept in a parallel state. A series resistance value of the tunneling magnetic resistances 44 and 45 is also referred to as a second resistance value.

The comparator 13 serving as a comparing section detects a voltage at the node A on the wiring 35 (=a voltage at the ninth terminal), which is substantially equal to the voltage of the selected bit line 33s, as a sense voltage Vs. At the same time, the comparator 13 detects a voltage at the node B on the wiring 36 (=a potential at the eleventh terminal) as a reference voltage Vref. Thus, the comparator 13 outputs a comparing result between the sense voltage and the reference voltage as a read data.

In this case, the reference tunneling magnetic resistance 27r, the tunneling magnetic resistance 27 and tunneling magnetic resistances 41, 42, 44, and 45 are have substantially the same structure. A tunneling magnetic resistance is shown as a TMR. The word "substantial" represents excluding a factor such as an error in fabrication which cannot be controlled. In this specification, the expression "substantial" should be considered in the same way as above.

Next, an operation of the magnetic random access memory according to the first embodiment of the present invention will be described below. In this case, the read operation from the magnetic random access memory will be described.

First, the read X selector 29 applies a read voltage to a selected read word line 32s to release or open unselected read word lines 32 other than the selected read word line in the plurality of read word lines 32. Thus, the MOS transistors 26 and the reference MOS transistor 26r are turned on.

The read Y selector 23 connects a selected bit line 33s and the reference bit line 34 to the ninth terminal of the TMR sequence A 11 and the eleventh terminal of the TMR sequence B 12 of the read circuit 1 through the wirings 35 and 36, respectively.

At this time, the first connection route of the first power supply (Vp)—the tunneling magnetic resistance 41 of the TMR sequence A 11—the tunneling magnetic resistance 42 thereof—the wiring 35—the selected bit line 33s—the tunneling magnetic resistance 27 of the selected cell 21s—ground is formed. Similarly, a second connection route of the first power supply (Vp)—the tunneling magnetic resistance 44 of the TMR sequence B 12—the tunneling magnetic resistance 45 thereof—the wiring 36—the reference bit line 34—the reference tunneling magnetic resistance 27r of the selected reference cell 22s—ground is formed.

The voltage of the first power supply (Vp) is divided by the tunneling magnetic resistances 27, 41, and 42 in the above first connection route. The comparator 13 of the read circuit 1 uses the voltage of the node A (voltage between tunneling magnetic resistances 27 and 41) as the sense voltage Vs. Similarly, the voltage of the first power supply (Vp) is divided by the reference tunneling magnetic resistance 27r and tunneling magnetic resistances 44 and 45 in the above second connection route. The comparator 13 of the read circuit 1 uses the voltage of the node B (voltage between the reference tunneling magnetic resistance 27r and the tunneling magnetic resistance 45) as the reference voltage Vref. The comparator 13 outputs a read result in accordance with the difference between the sense voltage Vs and the reference voltage Vref.

According to the above read operation, it is possible to read the data from the selected cell 21s of the magnetic random access memory.

In this case, an optimal value of the reference voltage Vref is discussed. It is preferable that the reference voltage Vref always takes an approximately intermediate value between the Vs(1) and Vs(0). It is assumed that the resistance value of each tunneling magnetic resistance is linearly converted into a voltage by the read circuit 1, and the reference voltage Vref is shown by the following equation (3).

$$V\text{ref} = V s(0) + k \cdot \{V s(1) - V s(0)\} \quad (3)$$

The resistance value of each tunneling magnetic resistance is influence by deviation on fabrication. Therefore, all the tunneling magnetic resistances in the memory cells do not always have a same value.

Figure 5A:
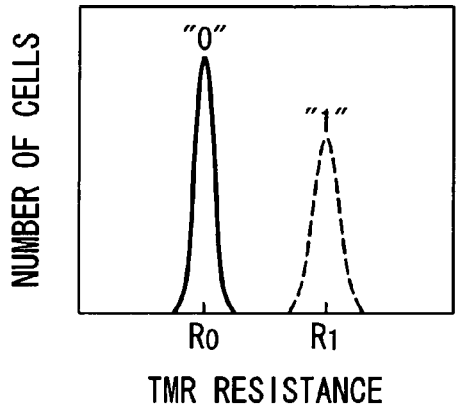
FIG. 5A is a block diagram showing a graph showing deviation in a resistance value of a tunneling magnetic resistance.

FIG. 5A is a graph showing a deviation of resistance values of the tunneling magnetic resistances. The vertical axis denotes the number of cells and the horizontal axis denotes resistance value of a tunneling magnetic resistance. R0 denotes the average value of resistance values for the data of "0". R1 denotes an average value of resistance values for the data of "1". In general, a distribution of resistance values of the tunneling magnetic resistances is provided in the form of a normal distribution. In this case, the deviation $\sigma_{R1}$ of the resistance values of the tunneling magnetic resistances storing the data of "1" is equal to a value obtained by multiplying the deviation $\sigma_{R0}$ of the resistance values of the tunneling magnetic resistances storing the data of "0" by (1+MR). Therefore, the relation of $\sigma_{R0} < \sigma_{R1}$ is always met.

Figure 5B:
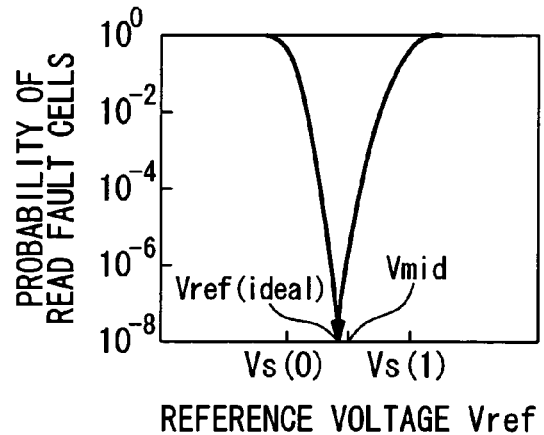
FIG. 5B is a block diagram of graphs showing calculation results of a relation between a reference voltage and probability of read defective cell.

FIG. 5B is a graph showing calculation results of the relation between reference voltage and probability of read defective cell. In this case, however, it is assumed that an MR ratio is equal to 20%, and the deviation $\sigma_{R0}$ of the resistance values of the tunneling magnetic resistances storing the data of "0" is 1.5%. Because the relation of $\sigma_{R0} < \sigma_{R1}$ is met, the reference voltage Vref at which the probability of read defective cell is minimized, that is, the reference voltage Vref (ideal) for maximizing the reliability in the read operation becomes a value slightly smaller than Vmid when the value of k is equal to 0.5 in the equation (3).

Assuming that the deviation of the sense voltages Vs(0) of the data of "0" due to the deviation of a TMR resistance values is $\sigma_{V0}$ and the deviation of the sense voltages Vs(1) of the data of "1" is $\sigma_{V0}$, the reference voltage Vref (ideal) is expressed by the following equation (4):

$$V\text{ref(ideal)} \approx \{\sigma_{V0} \cdot \sigma_{V1} \cdot \{Vs(1)-Vs(0)\} + \sigma_{V1}^2 \cdot Vs(0) - \sigma_{V0}^2 \cdot Vs(1)\}/\{\sigma_{V1}^2 - \sigma_{V0}^2\} \quad (4)$$

In this case, $\sigma_{V0} = \sigma_{R0}$ and $\sigma_{V1} = \sigma_{V0} \cdot (1+\text{MR ratio})$.

The value of k for the reference voltage Vref (ideal) was calculated from the expressions (3) and (4).

Figure 6:
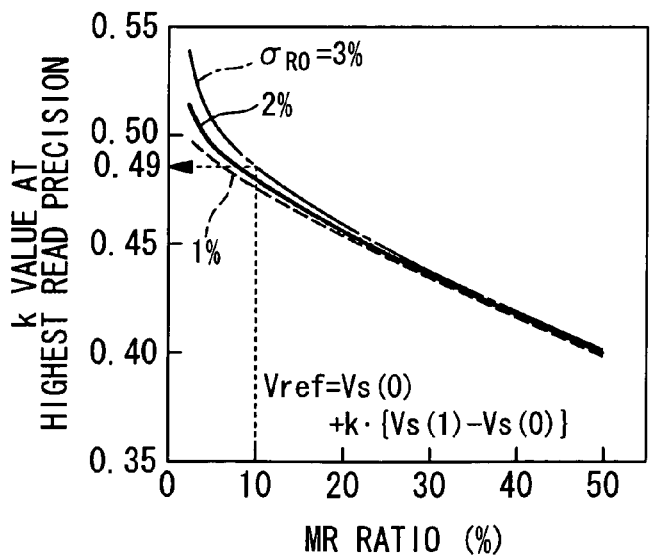
FIG. 6 is a block diagram of graphs showing Vref (ideal)

FIG. 6 is a graph showing calculated values of k. The vertical axis denotes a value of k for maximizing the read accuracy and the horizontal axis denotes MR ratio. In this case, curves for $\sigma_{R0}=1$, 2, and 3% were calculated. This is because the deviation $\sigma_{R0}$ of the resistance values of a tunneling magnetic resistances is generally known as 1 to 3%.

For example, in order to realize an MRAM of a mega bit class, a read error rate of $10^{-6}$ or less is necessary. Assuming that the resistance value deviation of the tunneling magnetic resistances is 1%, an MR ratio requires at least 10%. Therefore, from FIG. 6, it is preferable to generate the reference voltage in such a manner that the value of k shown in the equation (3) is 0.49 or less.

In this embodiment, the tunneling magnetic resistances used for the memory cell 21, the reference cell 22, and the load resistances (TMR sequences A 11 and B 12) are substantially the same. In this case, when the voltage applied to the tunneling magnetic resistance storing the data of "1" is V(1), the voltage applied to the tunneling magnetic resistance storing the data of "0" is V(0), and an MR ratio is MR, the voltage of a selected bit line, that is, the sense voltage Vs and the reference voltage Vref are expressed by the following expressions (5) and (6).

$$Vs(0)=Vp/(3+2 \cdot MR), Vs(1)=Vp/3 \quad (5)$$

$$V\text{ref}=Vp/(3+MR) \quad (6)$$

In this case, by setting Vp of this embodiment to 1.0 V, a simulation was carried out. The simulation results are shown in FIGS. 7 and 8.

Figure 7:
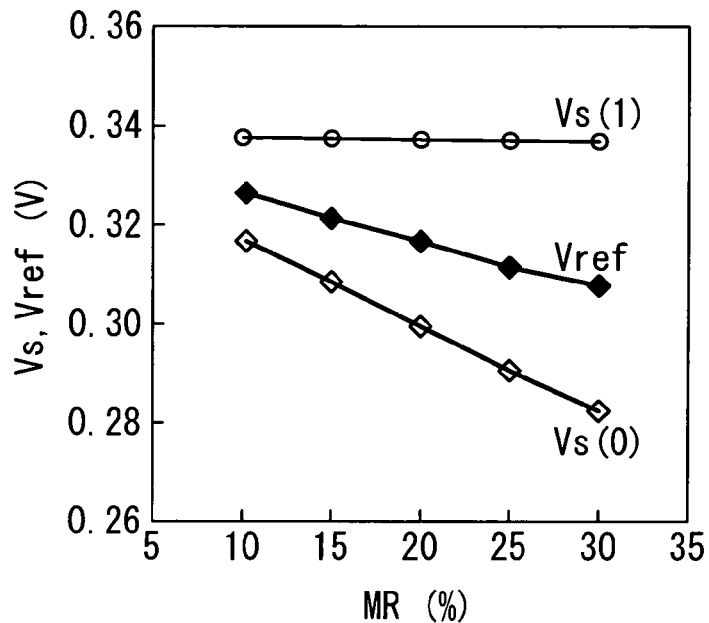
FIG. 7 is a block diagram showing graphs of MR ratio dependencies of a sense voltage and the reference voltage.

FIG. 7 is a graph showing dependencies of the sense voltage and the reference voltage on MR ratio. The vertical axis denotes the sense voltage Vs and the reference voltage Vref and the horizontal axis denotes the MR ratio. It would be found from the expressions (5) and (6) that the reference voltage Vref always takes an approximately intermediate value between Vs(1) and Vs(0) independently of change of the MR ratio. That is, it is possible to keep an optimal reference voltage independently of the MR ratio.

Figure 8:
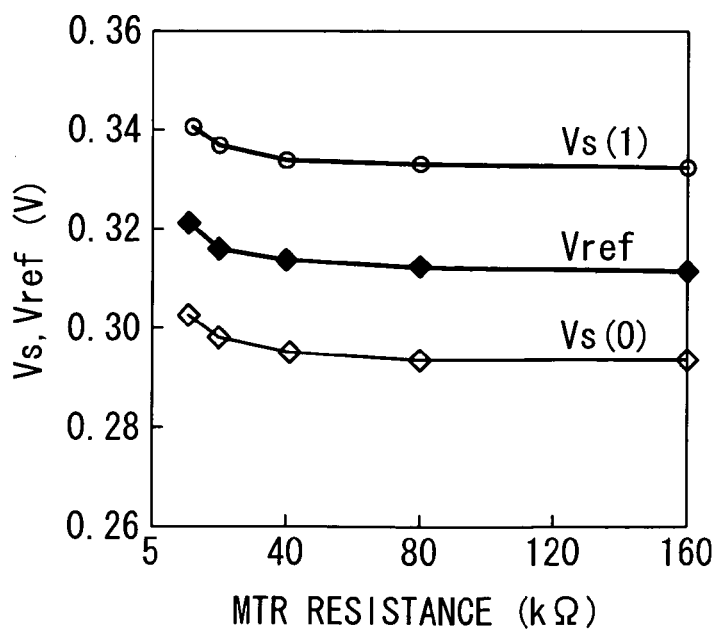
FIG. 8 is a block diagram showing graphs of resistance value dependencies of tunneling magnetic resistances of the sense voltage and the reference voltage.

FIG. 8 is a graph showing dependencies of the sense voltage and the reference voltage on the resistance value of tunneling magnetic resistance. The resistance value of the tunneling magnetic resistance rises with temperature. It would be found that the reference voltage Vref always takes an approximately intermediate value between Vs(1) and Vs(0) independently of the temperature change of the tunneling magnetic resistance. That is, it is possible to keep an optimal reference voltage independently of the temperature change of the tunneling magnetic resistance.

Figure 10:
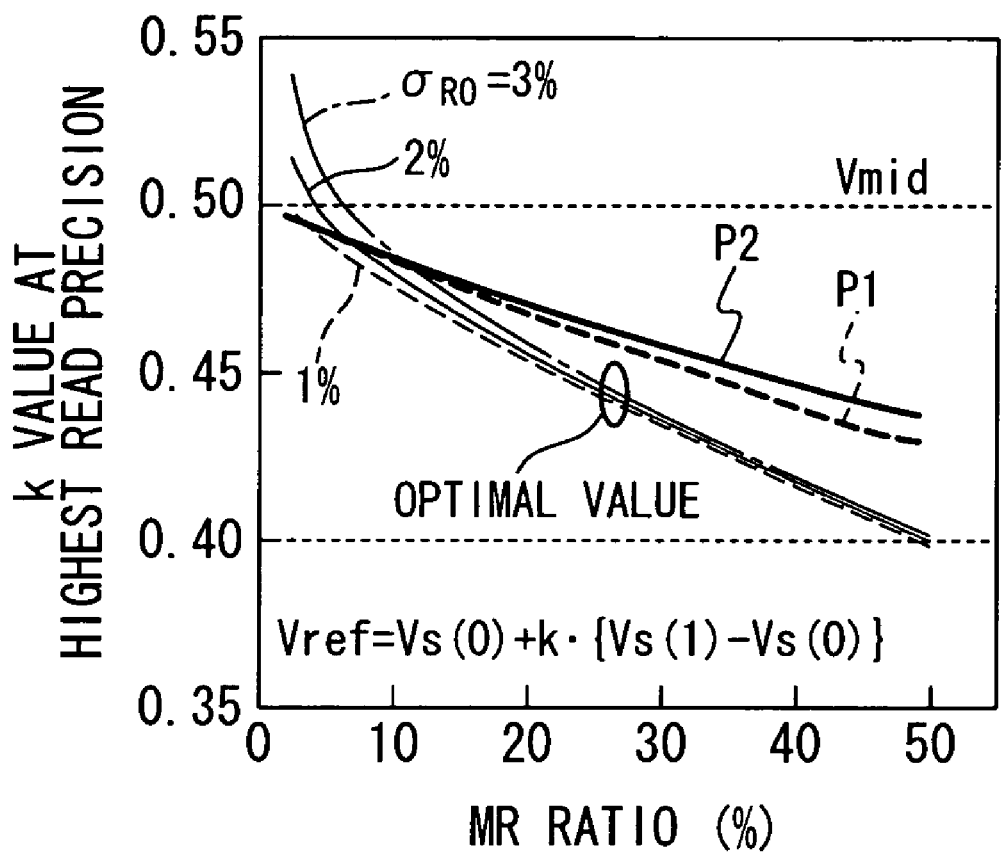
FIG. 10 is a block diagram showing graphs of relations between k for maximizing a read accuracy and MR ratio.

FIG. 10 is a graph showing a relation between the value of k for maximizing read accuracy and MR ratio. The vertical axis denotes the value of k for maximizing read accuracy and the horizontal axis denotes MR ratio. The curve of an optimal value (relating to $\sigma_{R0}$ of 1, 2, and 3%) is the same as that shown in FIG. 6. A curve P1 shows the simulation result in this embodiment and a result calculated in accordance with the expressions (3), (5), and (6). As a result, in an MR ratio equal to or higher than 10%, the value of k is kept in the previously described range equal to or lower than 0.49. That is, it is possible to keep the reference voltage Vref for minimizing the number of read defects.

Figure 1:
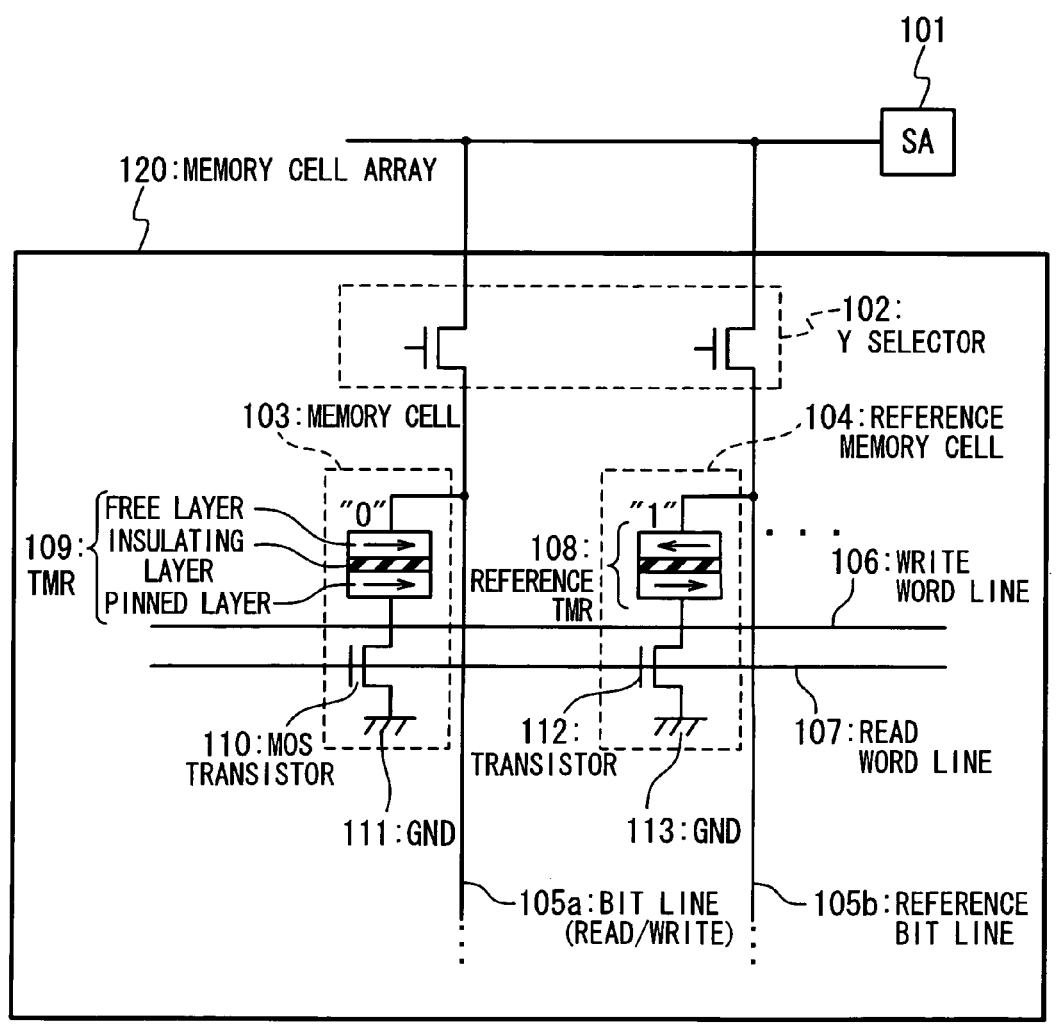
FIG. 1 is a block diagram showing a configuration of a typical conventional MRAM.
Figure 2:
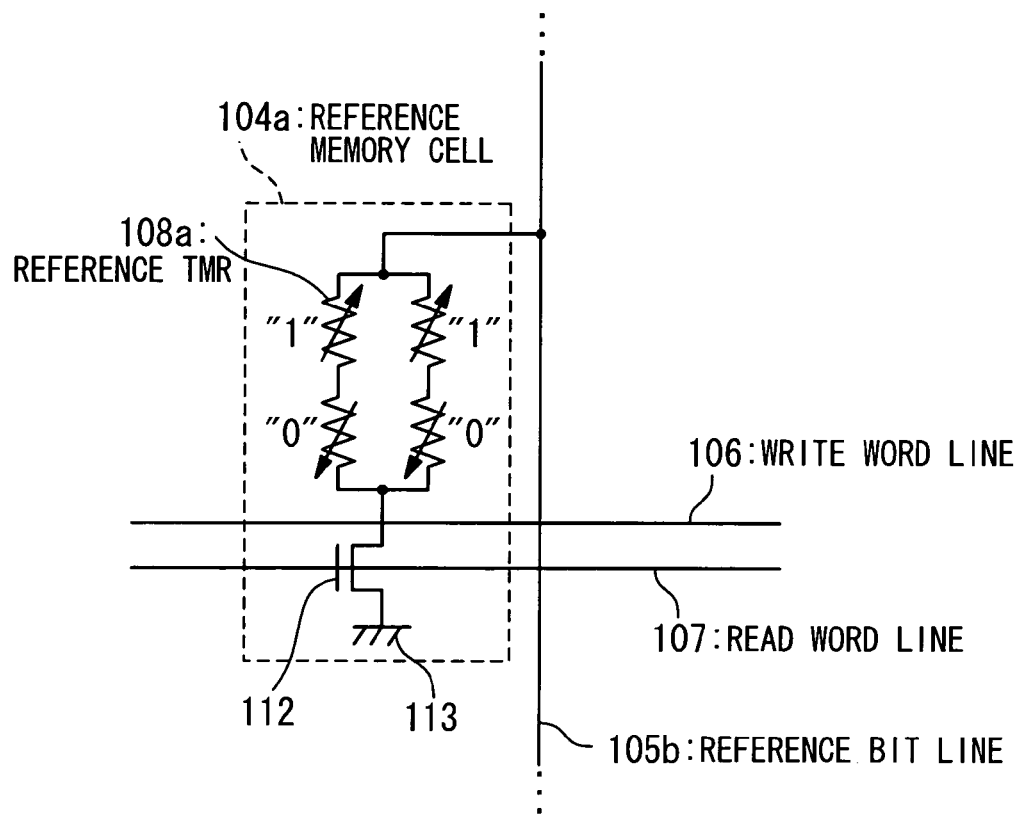
FIG. 2 is a block diagram showing a configuration of a conventional reference memory cell and its peripheral section.
Figure 3:
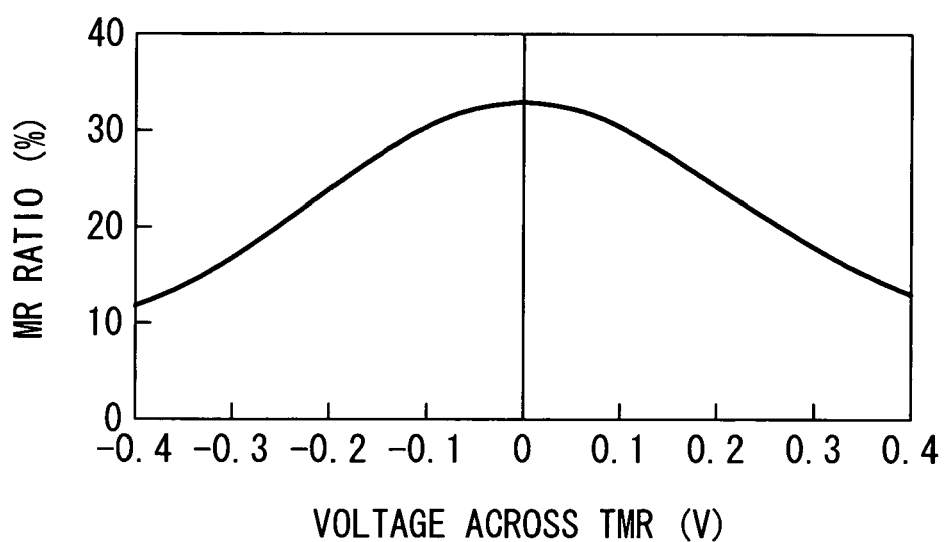
FIG. 3 is a block diagram of a graph showing a relation between voltage (both-end voltage) applied to both ends of a TMR and MR ratio.

According to the present invention, it is possible to prevent a relation between the sense voltages Vs(1) and Vs(0) and the reference voltage Vref from depending on change of the resistance value of the tunneling magnetic resistance (change due to applied voltage or change due to temperature). Therefore, a voltage of about Vp/3 is uniformly applied to each tunneling magnetic resistance. Therefore, each tunneling magnetic resistance is hardly influenced by the bias dependency peculiar to a TMR described with reference to FIG. 2. That is, the read operation having a higher reliability is realized.

According to the present invention, it is possible to minimize the area occupied by a reference cell in the memory array 2 because the reference cell 22 requires only one tunneling magnetic resistance and it is possible to restrain a word line defect due to a short circuit of the tunneling magnetic resistance 27r of the reference cell 22.

Second Embodiment

Next, the magnetic random access memory according to the second embodiment of the present invention will be described below.

First, the configuration of the magnetic random access memory according to the second embodiment of the present invention will be described below.

Figure 9:
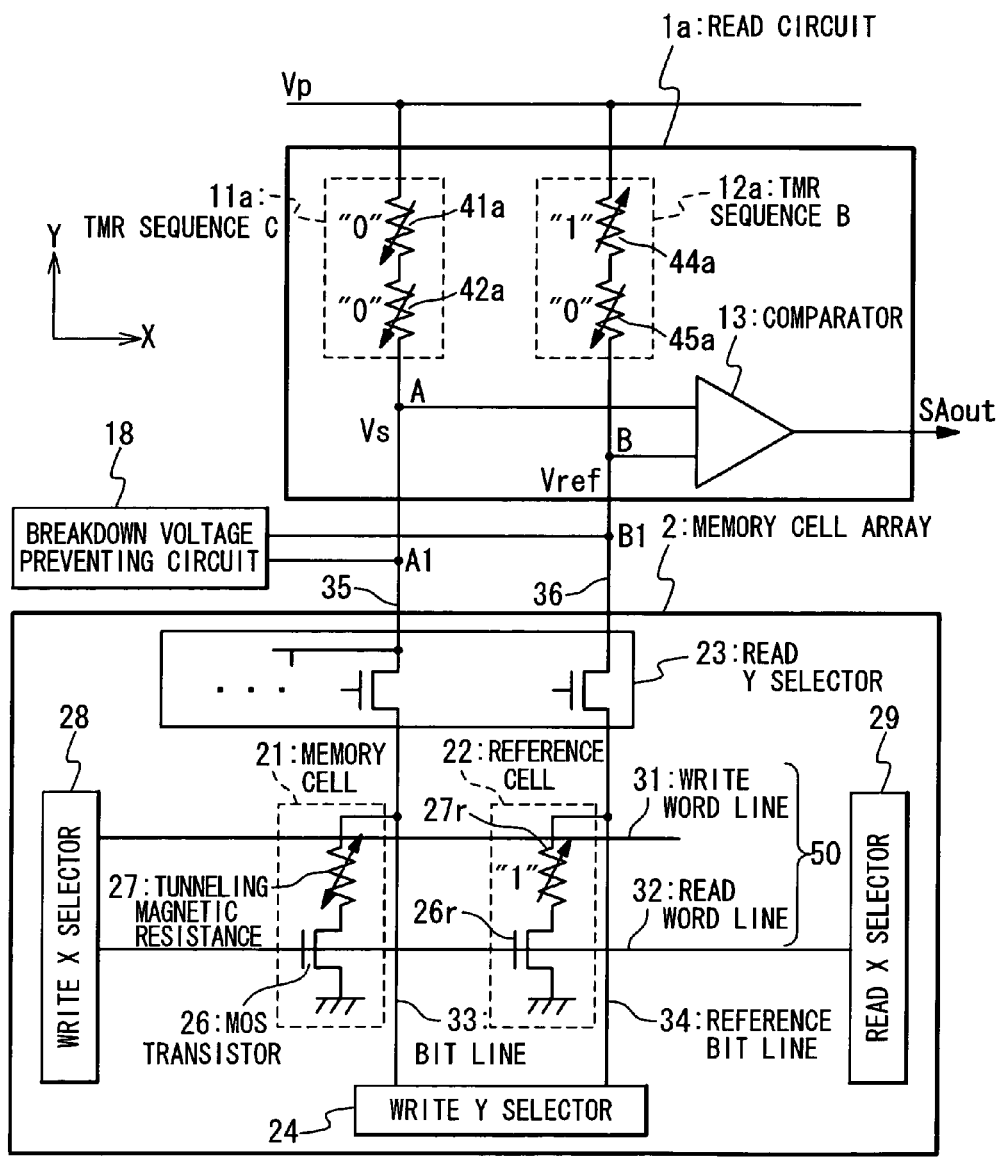
FIG. 9 is a block diagram of a second embodiment of a magnetic random access memory of the present invention.

FIG. 9 is a block diagram of the magnetic random access memory according to the second embodiment of the present invention. This embodiment is different from the first embodiment (FIG. 4) in that the TMR sequence A 11 is changed to a TMR sequence C 11a and data of "1" is always stored in the reference cell 22. The TMR sequence C 11a always stores the data of "0", showing that a TMR is kept in a parallel state in each of the tunneling magnetic resistances 41 and 42. A TMR sequence B 12a is the same as the TMR sequence B 12 and other components in FIG. 9 are the same as those of the first embodiment (FIG. 4). Therefore, their description is omitted.

Because the operation of the magnetic random access memory according to the second embodiment of the present invention is the same as that of the first embodiment, their description is omitted.

Also, in this case, the voltage of about Vp/3 is uniformly applied to every tunneling magnetic resistance. Therefore, every tunneling magnetic resistance is hardly influenced by bias dependency. In this case, selected bit line voltages, that is, the sense voltage Vs and the reference voltage Vref are expressed by the following equations.

$$Vs(0)=Vp/3, Vs(1)=(1+MR) \cdot Vp/(3+MR) \quad (5a)$$

$$Vref=(1+MR) \cdot Vp/(3+2MR) \quad (6a)$$

Similarly to a case of FIG. 4, the value of k becomes 0.49 or less in a MR ratio equal to or higher than 10% in accordance with the equations (3), (5a), and (6a). Moreover, the reference voltage Vref always takes an approximately intermediate value between Vs(1) and Vs(0) independently of change of the MR ratio. That is, it is possible to keep an optimal reference voltage without depending on the MR ratio. Moreover, the reference voltage Vref always takes approximately intermediate value between Vs(1) and Vs(0) independently of the temperature dependency of the tunneling magnetic resistance. That is, it is possible to keep an optimal reference voltage independently of a temperature change of the tunneling magnetic resistance.

As shown by the curve P2 (calculated in accordance with a simulation result and expressions (3), (5a), and (6a)) in FIG. 10, the value of k in the second embodiment becomes very close to an ideal value of k for maximizing the read reliability. That is, it is possible to keep an optimal reference voltage Vref capable of minimizing the number of read defects.

Third Embodiment

Next, the magnetic random access memory according to the third embodiment of the present invention will be described below.

First, the configuration of the magnetic random access memory according to the third embodiment of the present invention will be described.

Figure 11:
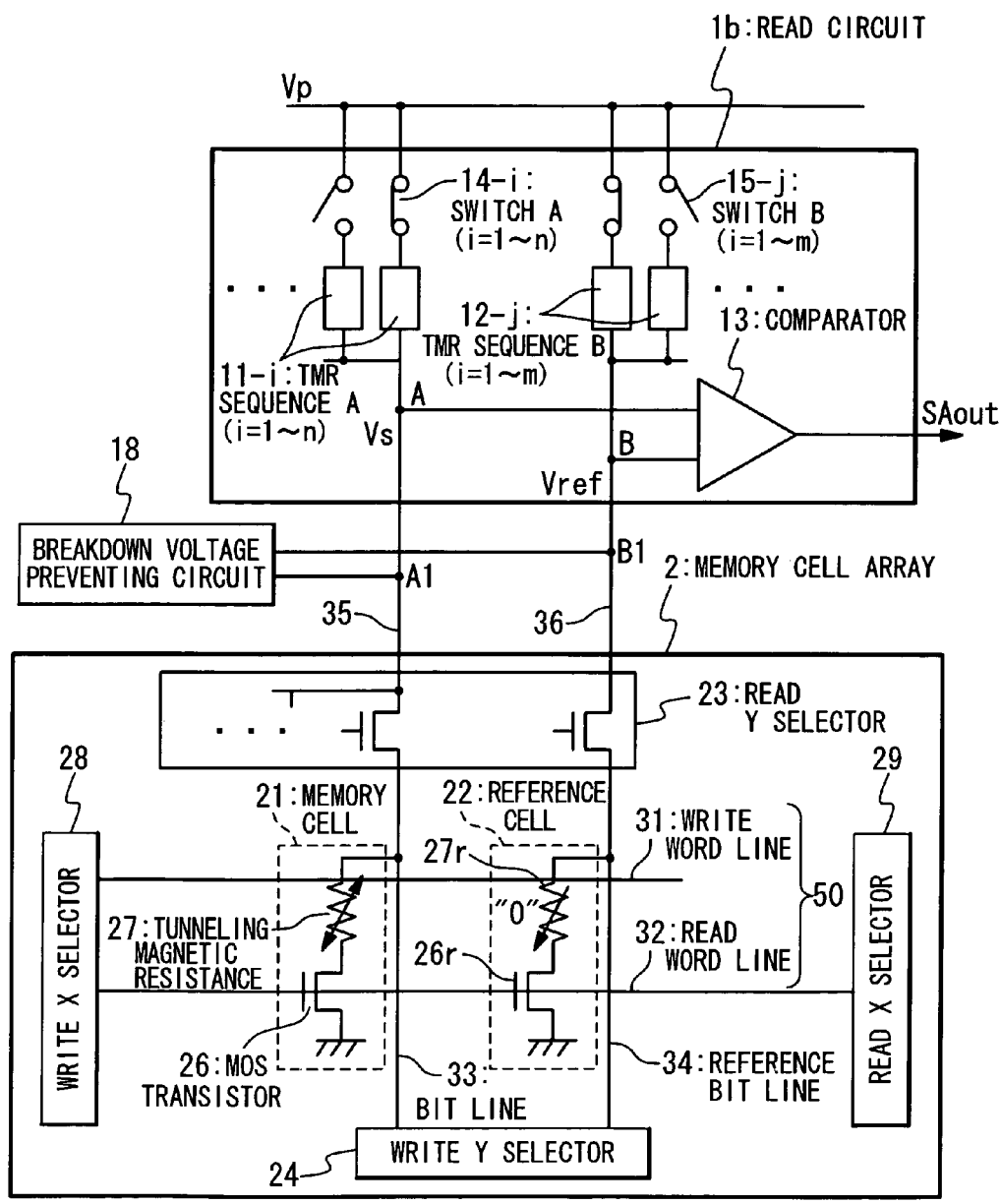
FIG. 11 is a block diagram showing another configuration of a third embodiment of a magnetic random access memory of the present invention.

FIG. 11 is a block diagram showing the configuration of the magnetic random access memory according to the third embodiment of the present invention. The configuration is different from the configuration shown in FIG. 4 in the following point in a read circuit 1b. That is, a plurality of sets are present, in each of which a TMR sequence A 11-i (i=1-n: natural number) and a switch 14-i (i=1-n: natural number) are connected in series. The plurality of sets are connected each other in parallel. Moreover, one end of each of the plurality of sets is connected to the wiring 35 and the other end of it is connected to the first power supply (Vp). Similarly, the plurality of sets are present in each of which a TMR sequence B 12-j (j=1-m: natural number) and a switch 15-j (j=1-m: natural number) are connected in series. The plurality of sets are connected to each other in parallel. Moreover, one end of each of the plurality of the sets is connected to the wiring 36 and the other end of it is connected to the first power supply (Vp).

In this case, a read circuit 1b can provide a spare TMR sequence for a case in which a tunneling magnetic resistance in each TMR sequence is damaged or a proper value is not shown, or a case of further improving a read yield. That is, the TMR sequence A 11-i and the TMR sequence B 12-j to be used are previously determined by the switches 14-i and 15-j.

Other components are the same as those of the first embodiment (FIG. 4) and its description is omitted.

Description of an operation of the magnetic random access memory according to the third embodiment of the present invention is omitted because they are the same as the case of the first embodiment.

According to the present invention, it is possible to improve the reliability at the time of read operation by using other TMR sequence even if a tunneling magnetic resistance in the present TMR sequence is damaged or a proper value is not shown or even in a case of further improving the read reliability.

This embodiment using a plurality of TMR sequences can be applied to other embodiments described in this specification. Moreover, the same advantage can be obtained.

Fourth Embodiment

Next, the magnetic random access memory according to the fourth embodiment of the present invention will be described below.

First, the configuration of the magnetic random access memory according to the fourth embodiment of the present invention will be described.

Figure 12:
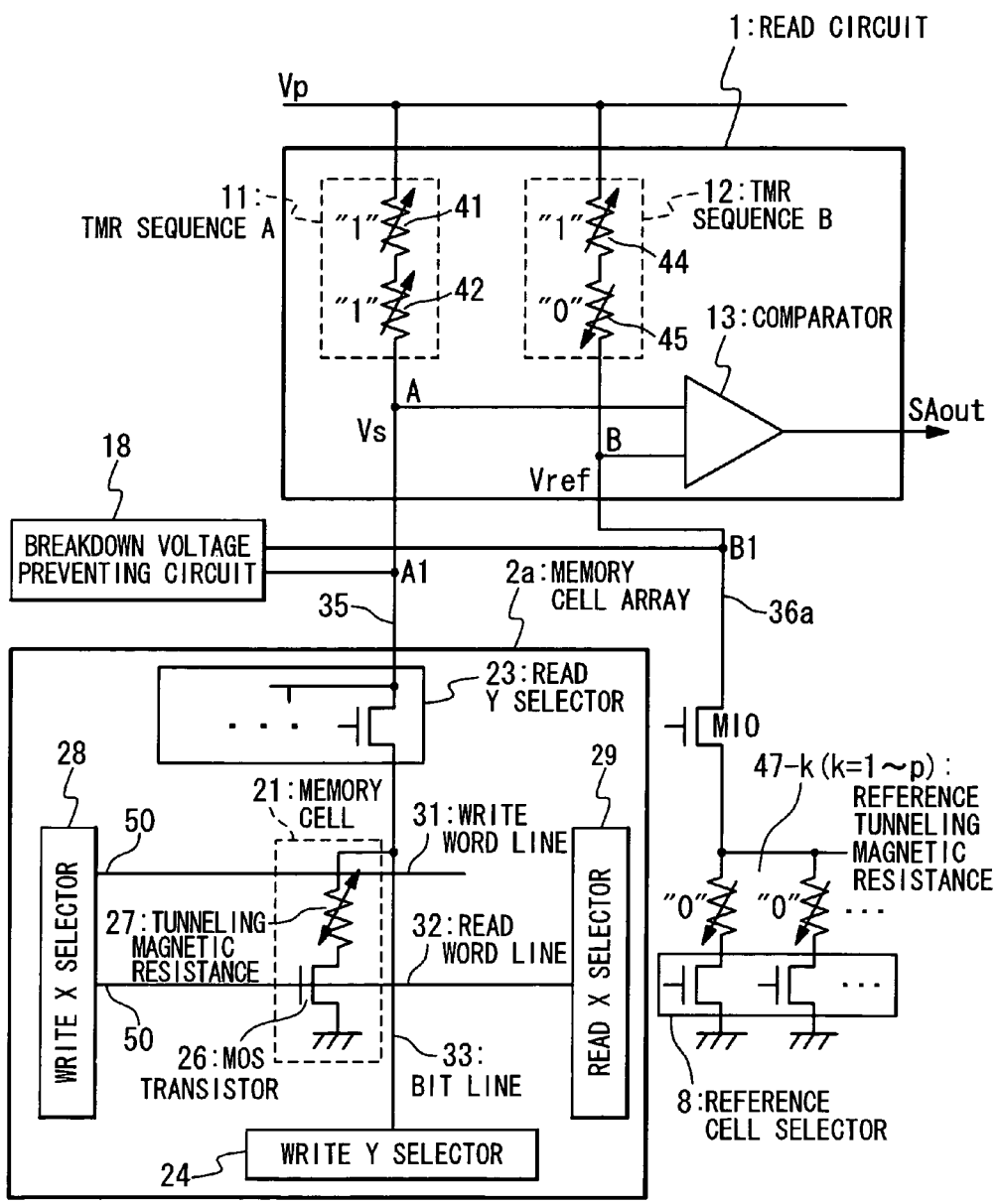
FIG. 12 is a block diagram showing another configuration of a fourth embodiment of the magnetic random access memory of the present invention.

FIG. 12 is a block diagram showing the configuration of the magnetic random access memory according to the fourth embodiment of the present invention. The configuration of the magnetic random access memory in the fourth embodiment is different from that of FIG. 4 in the following point in a memory cell array 2a. That is, the reference bit line 34 and the reference cells 22 present along the line 34 are not used. Therefore, the read Y selector 23 does not select the reference bit line 34. Instead, a wiring 36a, a plurality of reference tunneling magnetic resistances 47, a reference cell selector 8, and a transistor M10 are used.

The transistor M10 is connected to the wiring 36a (to be referred to as a reference bit line) which is connected to the eleventh terminal of the TMR sequence B 12 of the read circuit 1. The read circuit 1 is connected with the reference tunneling magnetic resistance 47 in the read operation by a control signal supplied to the gate of the transistor M10. The transistor M10 has a gate supplied with the control signal, a first connection terminal serving as one, connected to the read circuit 1, of terminals other than the gate, and a second connection terminal serving as the other end connected to the plurality of reference tunneling magnetic resistances 47-k.

One terminal of the reference tunneling magnetic resistance 47-k (k=1-p: natural number) is connected to the second connection terminal. The other terminal is connected to the reference selector 8. The plurality of reference tunneling magnetic resistances 47 is connected to the second connection terminal in parallel with each other. The reference tunneling magnetic resistance 47 has a spontaneous magnetization whose direction is reversed in accordance with stored data to take the first state or the second state. In this case, for example, the data of "0" showing that the TMR in the second state is in a parallel state is always stored for reference in the data read. Moreover, the element 47 is connected to the read circuit 1 through the wiring 36a in the read operation.

The reference cell selector 8 selects one of the plurality of reference tunneling magnetic resistances 47-k.

The reference tunneling magnetic resistances 47-k in this case can provide a spare tunneling magnetic resistance for a case in which a reference tunneling magnetic resistance is damaged or a proper value is not shown, or a case of further improving a read yield. That is, a tunneling magnetic resistance 47-$k$ to be used is determined by the reference cell selector 8 at the time of read operation or previously.

Other components are the same as those of the first embodiment (FIG. 4) and its description is omitted.

Because an operation of the magnetic random access memory according to the fourth embodiment of the present invention is the same as that of the first embodiment except that the reference tunneling magnetic resistance 47 is used instead of the reference cell 22 and the reference tunneling magnetic resistance 47 is selected by the transistor M10 and the reference cell selector 8, description of the operation is omitted.

According to the present invention, in addition to the advantage of the case in FIG. 4, even when the reference tunneling magnetic resistance is damaged, a proper value is not shown, or even in a case of further improving a read yield, it is possible to improve the reliability in the read operation by using another reference tunneling magnetic resistance.

This embodiment using a plurality of reference tunneling magnetic resistances can be applied to other embodiments described in this specification. Moreover, it is possible to obtain the same advantage.

Fifth Embodiment

First, the configuration of the magnetic random access memory according to the fifth embodiment of the present invention will be described below.

Figure 13:
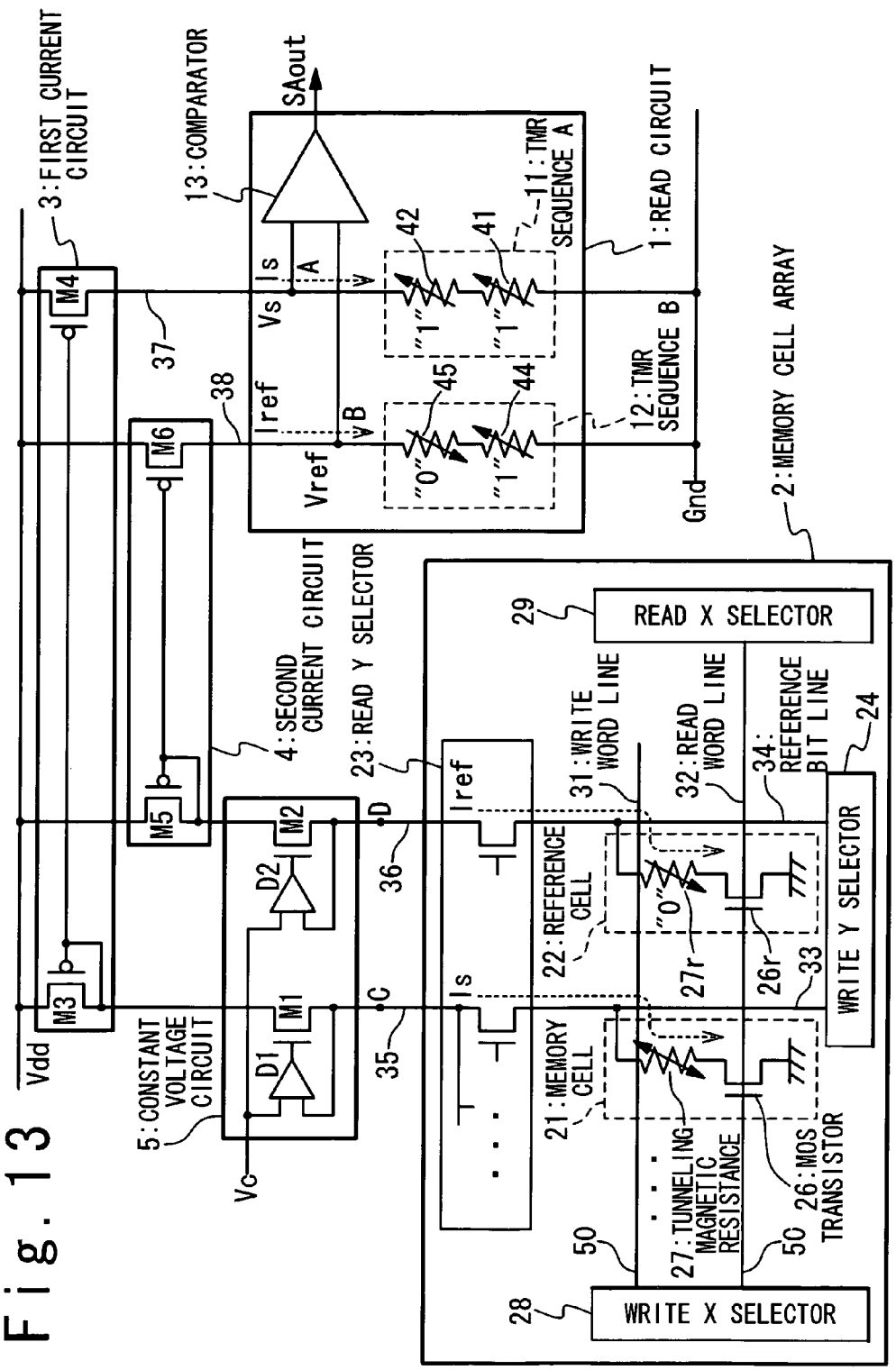
FIG. 13 is a block diagram of the first embodiment of the magnetic random access memory of the present invention.

FIG. 13 is a block diagram showing the configuration of the magnetic random access memory according to the fifth embodiment of the present invention. The magnetic random access memory has the read circuit 1, the memory cell array 2, a first current circuit 3, a second current circuit 4, and a constant voltage circuit 5.

The memory cell array 2 is the same as that of the first embodiment. Moreover, the fifth embodiment is the same as the first embodiment except that the constant voltage circuit 5 and the first current circuit 3 are connected in the middle of the wiring 35 extending from the read Y selector 23 and the constant voltage circuit 5 and the second current circuit 4 are connected in the middle of the wiring 36 extending from the read Y selector 23.

One end of the wiring 35 is connected to the selected bit line 33$s$ through the read Y selector 23. One end of the wiring 36 is connected to the reference bit line 34 through the read Y selector 23.

The read circuit 1 serving as a part of a read section is the same as the first embodiment except that the ninth terminal of the TMR sequence A 11 is connected not to the wiring 35 but to a wiring 37 and the eleventh terminal of the TMR sequence B 12 is connected not to the wiring 36 but to the wiring 37.

However, the wiring 37 is connected with the first current circuit 3 for supplying a current equal to the current flowing through the selected bit line 33$s$. Similarly, the wiring 38 is connected with the second current circuit 4 for flowing a current equal to the current flowing through the reference bit line 34.

The constant voltage circuit 5 serving as the first constant voltage section which is a part of the read section is connected with the first current circuit 3 and second current circuit 4. Moreover, the circuit 5 is connected with the wirings 35 and 36. This circuit applies a predetermined voltage Vc to the selected bit line 33$s$ and the reference bit line 34. The constant voltage circuit 5 is exemplified as a clamp circuit constituted of a differential amplifier D1 and a transistor M1.

One end of the first current circuit 3 serving as the first current section which is a part of the read section is connected between the constant voltage circuit 5 and a second power supply Vdd in the middle of the wiring 35 and the other end of it is connected to the middle of the wiring 37. The circuit 35 supplies the same sense current Is to a route of (the wiring 35—the selected bit line 33$s$—the selected cell 21$s$) and a route of (the wiring 37—the TMR sequence A 11). The first current circuit 3 is exemplified as a current mirror circuit constituted of a transistor M3 connected to the wiring 35 and a transistor M4 connected to the wiring 37.

One end of the second current circuit 4 serving as the second current section which is a part of the read section is connected between the constant voltage circuit 5 and the second power supply Vdd in the middle of the wiring 36 and the other end of it is connected to the middle of the wiring 38. The circuit 4 supplies the same reference current Iref to a route of (the wiring 365—the reference bit line 34—the reference cell 22) and a route of (the wiring 38—the TMR sequence B 12). The second current circuit 4 is exemplified as a current mirror circuit constituted of a transistor M5 connected to the wiring 36 and a transistor M6 connected to the wiring 38.

The comparator 13 compares magnitudes of the sense voltage Vs and reference voltage Vref generated at drain terminals of the transistor M4 of the first current circuit 3 and the transistor M6 of the second current circuit 4 and outputs the comparison result as a read result.

Next, an operation of the magnetic random access memory according to the fifth embodiment of the present invention will be described. In this case, the read operation of the magnetic random access memory will be described.

First, the read X selector 29 applies a read voltage to the selected read word line 32$s$ to open unselected read word lines 32 other than the selected read word line in the plurality of read word lines 32. Thus, the MOS transistor 26 and the reference MOS transistor 26$r$ are turned on.

The read Y selector 23 connects the selected bit line 33$s$ and reference bit line 34 to the wirings 35 and 36. Thus, the selected bit line 33$s$ is connected to the constant-voltage power supply 5 and the first current circuit 3. Similarly, the reference bit line 34 is connected to the constant-voltage power supply 5 and the second current circuit 4. Moreover, the selected bit line 33$s$ and reference bit line 34 are connected to the ninth terminal of the TMR sequence A 11 and the eleventh terminal of the TMR sequence B 12 of the read circuit 1 to be connected to the second power supply Vdd.

In this case, a third connection is formed of a route of the second power supply Vdd—the first current circuit 3 (the transistor M3)—the first constant-voltage power supply 5 (the transistor M1)—the selected bit line 33$s$—the selected cell 21$s$ (the tunneling magnetic resistance 27)—ground. Similarly, a fourth connection is formed of a route of the second power supply Vdd—the second current circuit 4 (the transistor M5)—the first constant—voltage power supply 5 (the transistor M2)—the reference bit line 34—the selected reference cell 22$s$ (the reference tunneling magnetic resistance 27$r$) —ground.

The sense current Is corresponding to the data stored in the tunneling magnetic resistance 27 of the selected cell 21$s$ flows through the third connection in accordance with the voltage of the second power supply Vdd. The same sense current Is flows through a fifth connection of a route of the second power supply Vdd—the first current circuit 3 (the transistor M4)—the TMR sequence A 11 (the tunneling magnetic resistances 42 and 41)—ground in accordance with the sense current Is by the first current circuit 3 (current mirror circuit). In this case, the voltage of the node A is used as the sense voltage Vs in accordance with the current Is.

Similarly, a reference current Ir corresponding to the data stored in the reference tunneling magnetic resistance 27r of the selected reference cell 22s connected to the above fourth connection flows in accordance with the voltage of the second power supply Vdd. The same reference current Ir flows through a sixth connection of a route of the second power supply Vdd—the second current circuit 4 (the transistor M6)—the TMR sequence B 12 (the tunneling magnetic resistances 45 and 44)—ground in accordance with the reference current Ir by the second current circuit 4 (current mirror circuit). In this case, the voltage of the node B is used as the reference voltage Vref. Also, the comparator 13 outputs a read result in accordance with the difference between the sense voltage Vs and the reference voltage Vref.

It is possible to read out the data for the selected cell 21s of the magnetic random access memory in accordance with the above read operation.

In this embodiment, tunneling magnetic resistances used for the memory cell 21, the reference cell 22, and load resistances (the TMR sequences A 11 and B 12) are substantially the same. In this case, assuming that a voltage applied to a tunneling magnetic resistance storing data of "1" is V(1), a voltage applied to a tunneling magnetic resistance storing data of "0" is V(0), and a MR ratio is MR, voltages of a selected bit line, that is, the sense voltage Vs and reference voltage Vref are shown by the following expressions.

$$Vs(0)=2(1+MR)\cdot Vc, Vs(1)=2\cdot Vc \qquad (7)$$

$$Vref=2(1+0.5-MR)\cdot Vc \qquad (8)$$

In this case, simulation is carried out by setting Vc to 0.3 V in this embodiment. The results are shown in FIGS. 14 and 15.

Figure 14:
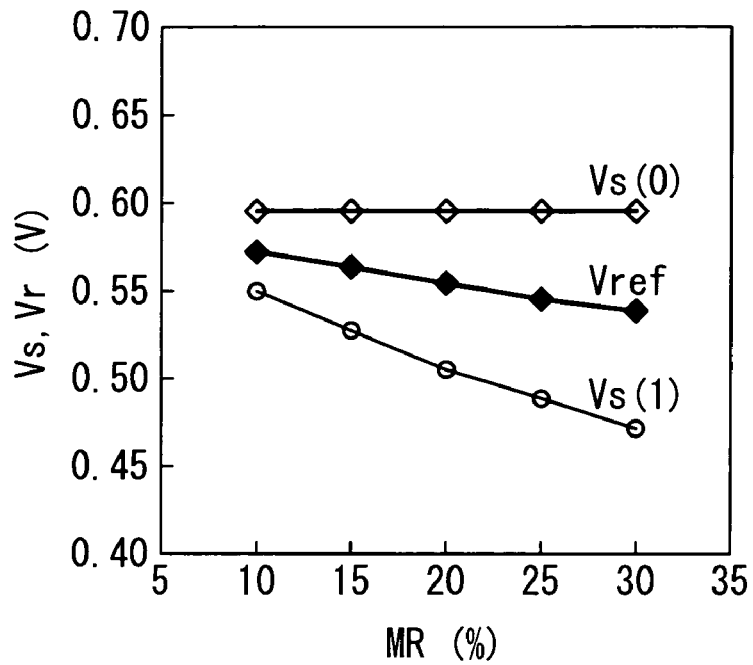
FIG. 14 is a block diagram showing graphs of MR ratio dependencies of the sense voltage and the reference voltage.

FIG. 14 is a graph showing dependencies of the sense voltage and the reference voltage on MR ratio. The vertical axis denotes the sense voltage Vs and the reference voltage Vref and the horizontal axis denotes MR ratio. It would be found from the equations (7) and (8) that the Vref always takes an approximately intermediate value between Vs(1) and Vs(0) independently of change of the MR ratio. That is, it is possible to keep an optimal reference voltage independently of the MR ratio.

Figure 15:
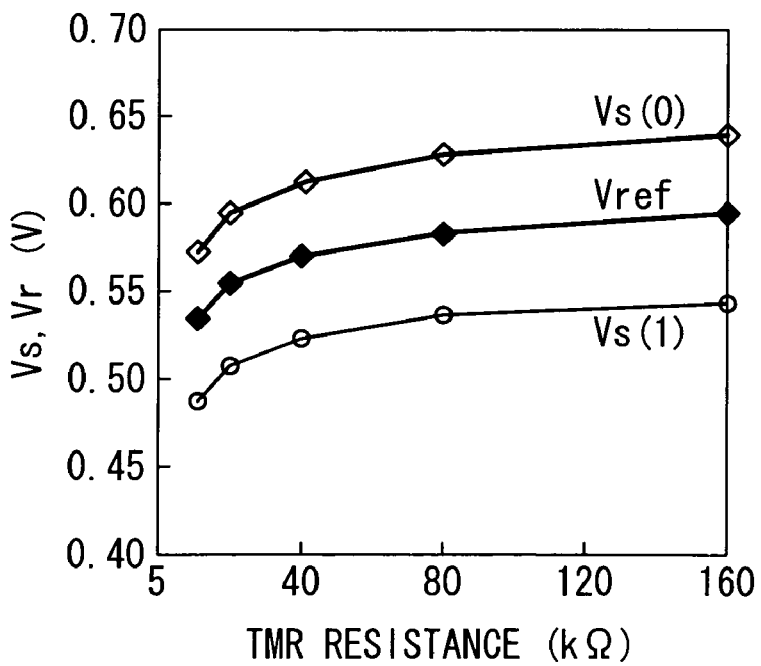
FIG. 15 is a block diagram of graphs showing resistance value dependencies of tunneling magnetic resistances of the sense voltage and the reference voltage.

FIG. 15 is a graph showing the dependencies of tunneling magnetic resistances of the sense voltage and the reference voltage on resistance value. The resistance value of the tunneling magnetic resistance rises due to temperature. It would be found that the Vref always takes an approximately intermediate value b between Vs(1) and Vs(O) independently of the temperature dependency of the tunneling magnetic resistance. That is, it is possible to keep an optimal reference voltage independently of the temperature change of the tunneling magnetic resistance.

It could be understood from the result of the simulation and the equations (3), (7), and (8) that the value k is equal to 0.5 without depending on both an MR ratio and the resistance value of the tunneling magnetic resistance. Though this value of k is not equal to or less than 0.49 for maximizing a read liability, it is possible to adjust the value of k to a value equal to or less than 0.49 by adding a trimming circuit to be described later. Also, because one TMR is enough for a reference cell, it is possible to minimize the area occupied by the reference cell in a memory array and minimize the number of a word line defect due to a TMR short circuit.

According to the present invention, it is possible to prevent a relation of the sense voltages of Vs(1) and Vs(0) and the reference voltage Vref from depending on a change of resistance value of the tunneling magnetic resistance (change due to applied voltage or change due to temperature). Therefore, a voltage of about Vp/3 is uniformly applied to each tunneling magnetic resistance. Therefore, the relation is hardly influenced by the bias dependency peculiar to a TMR described with reference to FIG. 2. That is, it is possible to carry out the read operation having a high reliability.

According to the present invention, because the reference cell 22 requires only one tunneling magnetic resistance, it is possible to minimize the area occupied by a reference cell in the memory cell array 2 and restrain a word line defect due to a short circuit of the tunneling magnetic resistance 27r of the reference cell 22.

Sixth Embodiment

Next, the magnetic random access memory according to the sixth embodiment of the present invention will be described below.

First, the configuration of the magnetic random access memory according to the sixth embodiment of the present invention will be described below.

Figure 16:
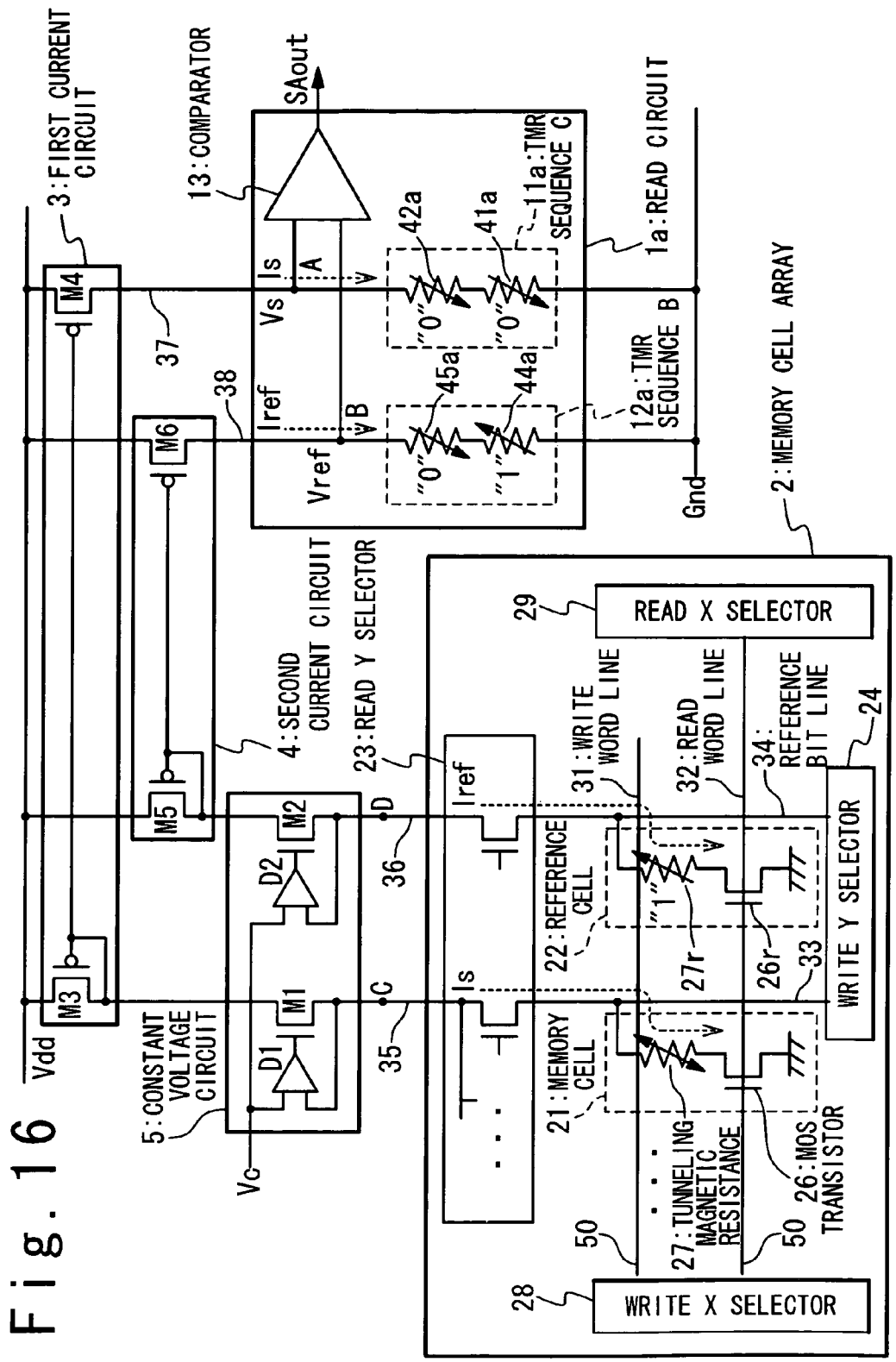
FIG. 16 is a block diagram of a sixth embodiment of the magnetic random access memory of the present invention.

FIG. 16 is a block diagram showing the configuration of the magnetic random access memory according to the sixth embodiment of the present invention. This embodiment is different from the fifth embodiment (FIG. 13) in that the TMR sequence A 11 is changed to a TMR sequence C 11a and data of "1" is always stored in the reference cell 22. The TMR sequence C 11a stores data of "0" showing that the TMR is always parallel with the tunneling magnetic resistances 41 and 42. The TMR sequence B 12a is the same as the TMR sequence B 12 and other components in FIG. 16 are the same as the fifth embodiment and its description is omitted.

An operation of the magnetic random access memory according to the sixth embodiment of the present invention is omitted because it is the same as the fifth embodiment.

Also, in this case, a voltage of about Vp/3 is uniformly applied to every tunneling magnetic resistance. Therefore, every tunneling magnetic resistance is hardly influenced by the bias dependency. In this case, selected bit line voltages, that is, the sense voltage Vs and the reference voltage Vref are shown by the following equations.

$$Vs(0)=2\cdot Vc, Vs(1)=2\cdot Vc/(1+MR) \qquad (7a)$$

$$Vref=(2+MR)\cdot Vc/(1+MR) \qquad (8a)$$

Similarly to the case of FIG. 8, the Vref always takes an approximately intermediate value between Vs(1) and Vs(0) independently of a change of MR ratio in accordance with a simulation result and the equations (7a) and (8a). That is, it is possible to keep an optimal reference voltage without depending on an MR ratio. Moreover, the Vref always takes an approximately intermediate value between Vs(1) and Vs(0) independently of the temperature dependency of the tunneling magnetic resistance. That is, it is possible to keep an optimal reference voltage independently of the temperature change of the tunneling magnetic resistance.

However, the value of k is equal to 0.5 independently of both MR ratio and resistance value of a tunneling magnetic resistance in accordance with a simulation result and the equations (3), (7a), and (8a). Though the value of k is not equal to or less than 0.49 for maximizing the read reliability described above, it is possible to adjust the value of k to a value equal to or less than 0.49 by adding a trimming circuit to be described later.

Seventh Embodiment

Next, the magnetic random access memory according to the seventh embodiment of the present invention will be described below.

First, the configuration of the magnetic random access memory according to the seventh embodiment of the present invention will be described.

Figure 17:
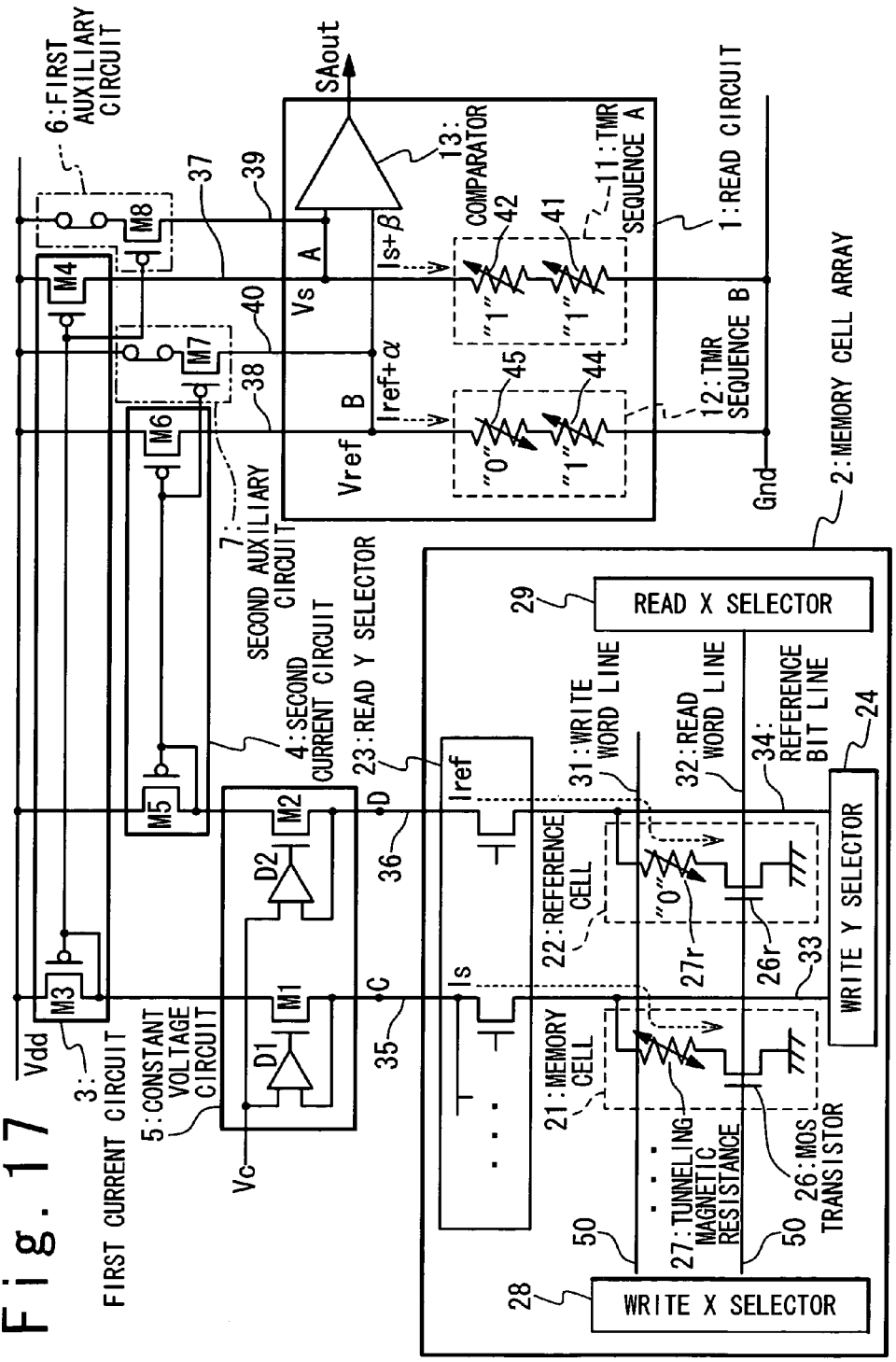
FIG. 17 is a block diagram of the sixth embodiment of the magnetic random access memory of the present invention.

FIG. 17 is a block diagram showing the configuration of the magnetic random access memory according to the seventh embodiment of the present invention. This embodiment is different from the fifth embodiment (FIG. 16) in the following points. A wiring 39 is provided to the node A of the comparator 13 in parallel with the wiring 37. A wiring 40 is provided to the node B of the comparator 13 in parallel with the wiring 38.

One end of the wiring 39 is connected to the second power supply Vdd through the first auxiliary circuit 6 and the other end of it is connected to the node A. One end of the wiring 40 is connected to the second power supply Vdd through a second auxiliary circuit 7 and the other end of it is connected to the node B. Also, the other components of FIG. 17 are the same as the fifth embodiment (FIG. 16) and its description is omitted.

The first auxiliary circuit 6 serving as the first auxiliary section as a part of the read section is provided in the middle of the wiring 39. The circuit 6 additionally supplies a current β to a route of the node A—the wiring 37—the TMR array A 11. The first auxiliary circuit 6 is such as a trimming circuit and includes a transistor M8 and a switch. The gate electrode of the transistor M8 is connected to the gate electrodes M3 and M4 of the first current circuit 3, one of electrodes other than the gate electrode is connected to the node A, and the other end is connected to the second power supply Vdd through a switch.

The second auxiliary circuit 7 serving as a second auxiliary portion as a part of the read section is provided in the middle of the wiring 40. The circuit 7 additionally supplies a current α to a route of the node B—the wiring 38—the TMR array B 12. The second auxiliary circuit 7 is such as a trimming circuit and includes a transistor M7 and a switch. The gate electrode of the transistor M7 is connected to gate electrodes of the transistors M5 and M6 of the second current circuit 4 and one of electrodes other than the gate electrode is connected to the node B and other end is connected to the second power supply Vdd through a switch.

Because an operation of the magnetic random access memory according to the seventh embodiment of the present invention is the same as in the fifth embodiment except that a current flowing through the read circuit 1 is fine adjusted as described below, its description is omitted.

That is, when the sense current Is flows through a route of the second power supply Vdd—the first current circuit 3 (the transistor M3)—the first constant-voltage power supply 5 (the transistor M1)—the selected bit line 33s—the selected bit line 21s (the tunneling magnetic resistance 27)—ground, the sense current Is flows through a route of the second power supply Vdd—the first current circuit 3 (the transistor M4)—the node A and the current β for fine adjustment flows through a route of the second power supply Vdd—the first auxiliary circuit 6 (the transistor M8)—the node A. As a result, the sense current Is and current β flow through a route of node A—the TMR sequence A 11 (the tunneling magnetic resistances 42 and 41)—ground.

Similarly, when the reference current Ir flows through a route of second power supply Vdd—the second current circuit 4 (the transistor M5)—the first constant-voltage power supply 5 (the transistor M2)—the reference bit line 34—the selection reference cell 22s (the tunneling magnetic resistance 27r)—ground, the reference current Ir flows through a route of the second power supply Vdd—the second current circuit 4 (the transistor M6)—the node B and the current α for fine adjustment flows through a route of the second power supply Vdd—the second auxiliary circuit 7 (the transistor M7)—the node B. As a result, the reference current Ir and current α flow through a route of the node B—the TMR sequence B 12 (the tunneling magnetic resistances 45 and 44)—ground.

The transistors M7 and M8 are added to fine-adjust a reference voltage so that the value of k is equal to or less than 0.49 in the fifth embodiment and it is preferable that the ratio (W/L) between their gate width W and their gate length L is small enough.

It is also allowed to use only either of the transistors M7 and M8 by controlling a switch. It is also possible to use at least a plurality of the transistors M7 or M8 and it is allowed to simultaneously select them by controlling a switch.

According to the present invention, it is possible to set the value of k to a value equal to or less than 0.49 also in the fifth embodiment or the sixth embodiment. That is, it is possible to obtain a voltage to be applied to a tunneling magnetic resistance or an optimal reference voltage not influenced by temperature.

This embodiment using an auxiliary circuit can be also applied to other embodiments described in this specification. Moreover, the same advantage can be obtained.

Eighth Embodiment

Next, the magnetic random access memory according to the eighth embodiment of the present invention will be described below.

First, the configuration of the magnetic random access memory according to the eighth embodiment of the present invention will be described.

Figure 18:
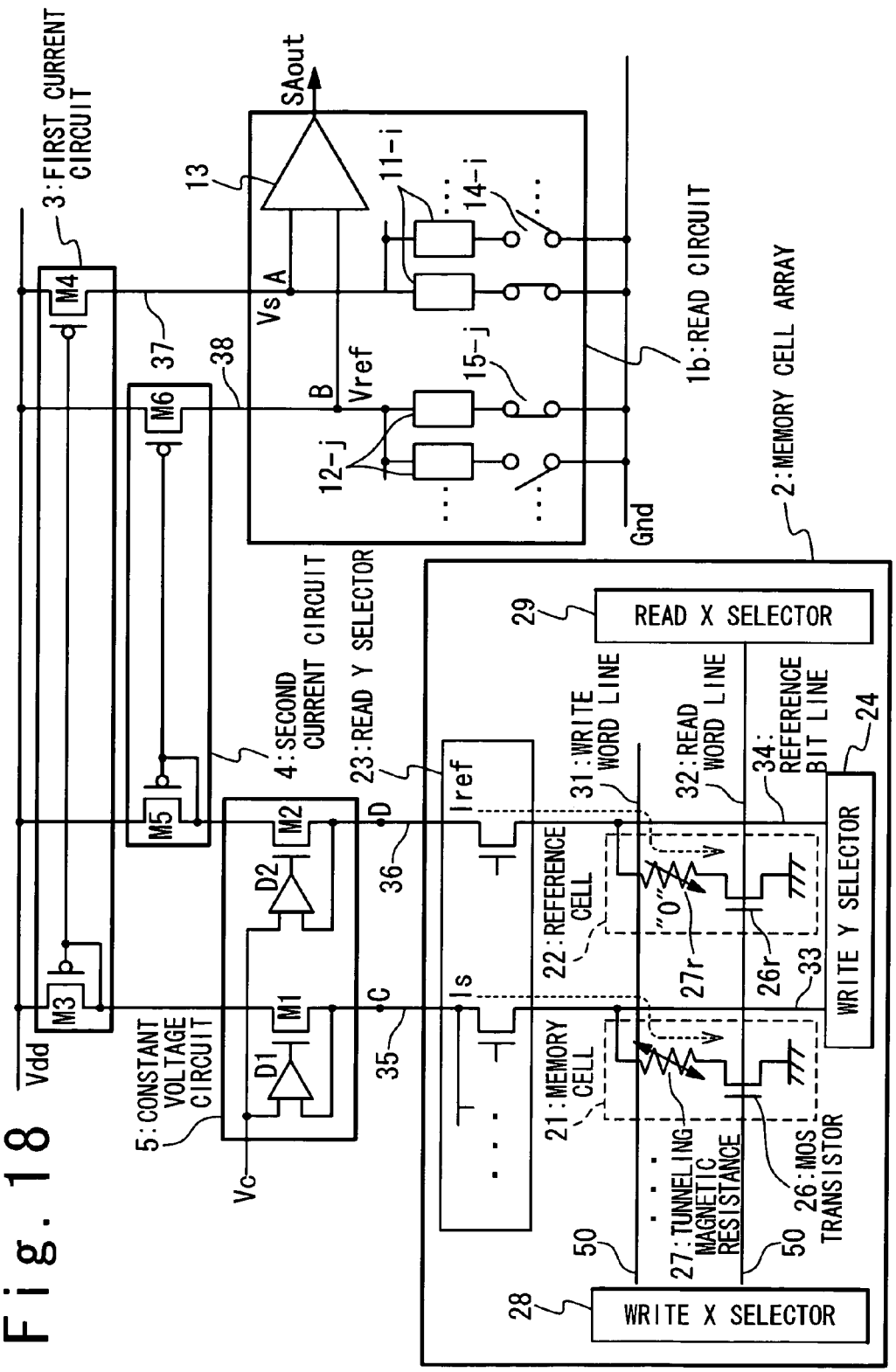
FIG. 18 is a block diagram showing another configuration of an eighth embodiment of the magnetic random access memory of the present invention.

FIG. 18 is a block diagram showing the configuration of the magnetic random access memory according to the eighth embodiment of the present invention. The configuration is different from that in FIG. 13 in the following point in the read circuit 1b. That is, there are a plurality of sets in which the TMR sequences A 11-$i$ ($i$=1–n: natural number) and the switches 14-$i$ ($i$=1–n: natural number) are connected in series. The plurality of sets are mutually connected in parallel. Moreover, one end of each set is connected to the wiring 37 and the other end of it is connected to a ground. Similarly, there are a plurality of sets in which TMR sequences B 12-$j$ ($j$=1–m: natural number) and switches 15-$j$ ($j$=1–m: natural number) are connected in series. The plurality of sets are mutually connected in parallel. Moreover, one end of each set is connected to the wiring 38 and the other end of it is connected to a ground.

In this case, the read circuit 1b can provide a spare TMR sequence preparing for a case in which a tunneling magnetic resistance in each TRM sequence is damaged or a proper value is not shown or a case of improving a read yield. That is, the TMR sequence A 11-$i$ and the TMR sequence B 12-$j$ to be used are determined by the switches 14-$i$ and 15-$j$ at the time or previously of read operation and used.

Other components are the same as those of the fifth embodiment (FIG. 13) and its description is omitted.

Because the operation of the magnetic random access memory according to the eighth embodiment of the present invention is the same as that of the fifth embodiment, the description is omitted.

According to the present invention, in addition to the advantage in FIG. 13, it is possible to improve the reliability in the read operation by using another TMR sequence even when the tunneling magnetic resistance in the TMR sequence is damaged or a proper value is not shown or in a case of further improving a read yield.

This embodiment using the plurality of TMR sequences can be also applied to other embodiments described in this specification. Moreover, the same advantage can be obtained.

Ninth Embodiment

Next, the magnetic random access memory according to the ninth embodiment of the present invention will be described below.

First, the configuration of the magnetic random access memory according to the ninth embodiment of the present invention will be described.

Figure 19:
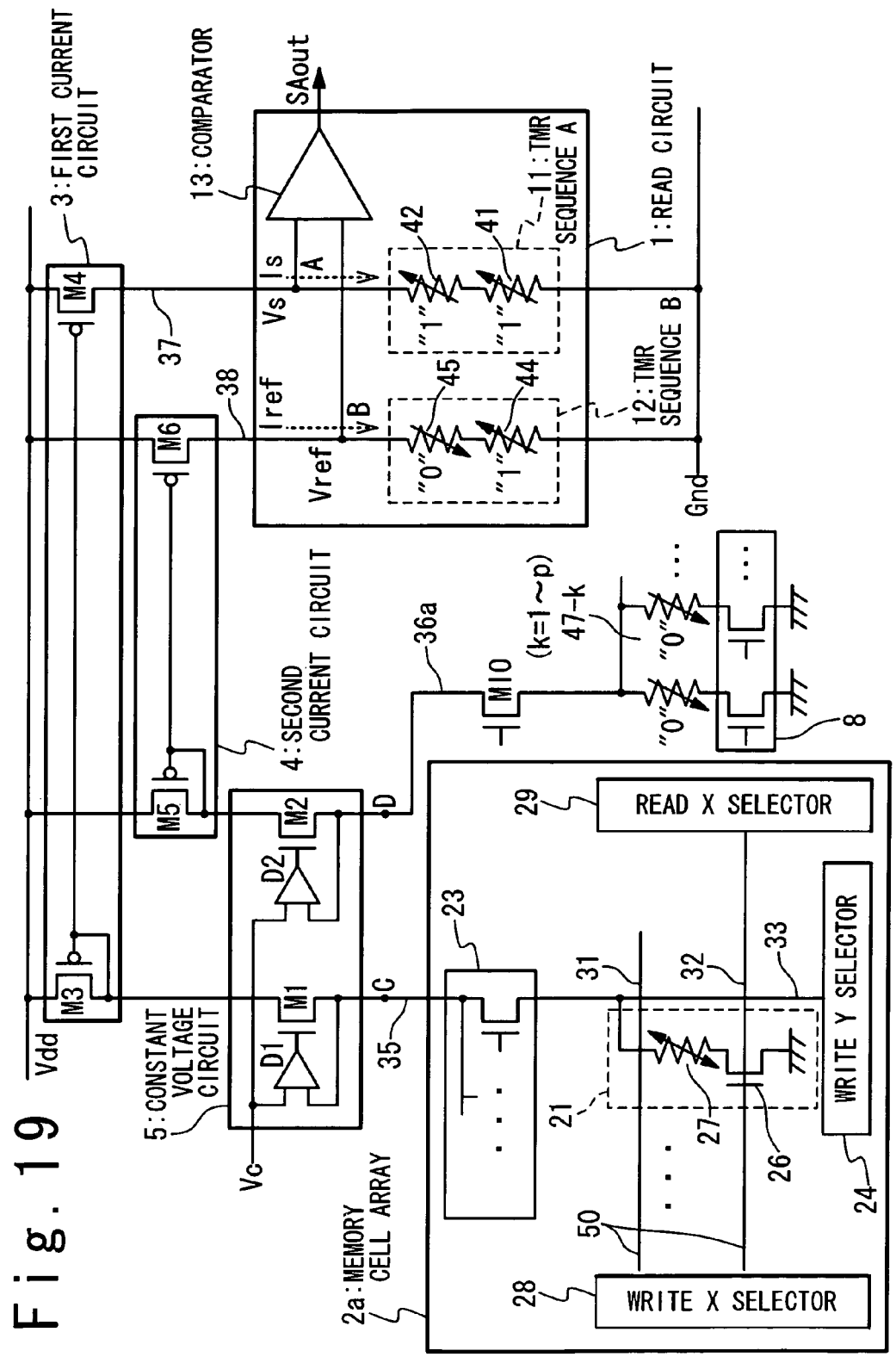
FIG. 19 is a block diagram showing another configuration of a ninth embodiment of the magnetic random access memory of the present invention.

FIG. 19 is a block diagram showing the configuration of the magnetic random access memory according to the ninth embodiment of the present invention. The configuration is different from that of FIG. 13 in the following point in the memory cell array 2a. That is, the reference bit line 34 and reference cell 22 present along the bit line 34 are not used. Therefore, the read Y selector 23 does not select the reference bit line 34. A plurality of reference tunneling magnetic resistances 47, a reference cell selector 8, and a transistor M10 are used instead of the reference bit line 34 and the reference cell 22.

The transistor M10 is connected to the wiring 36a which is connected to the constant voltage circuit 5. The constant voltage circuit 5, the second current circuit 4, and the reference tunneling magnetic resistance 47 are connected in the read operation in accordance with a control signal supplied to the gate of the transistor M10. The transistor M10 has a gate to which the control signal is supplied, the first connection terminal serving as one of terminals other than the gate connected to the wiring 36a, and the second connection terminal serving as the other terminal connected to the plurality of tunneling magnetic resistances for reference 47-k.

Because the reference tunneling magnetic resistances 47-k (k=1–p: natural number) and the reference cell 8 are the same as those of the fourth embodiment, their description is omitted.

Because the operation of the magnetic random access memory according to the ninth embodiment of the present invention is the same as that of the fifth embodiment except that the reference tunneling magnetic resistance 47 is used instead of the reference cell 22 and the reference tunneling magnetic resistance 47 is selected by the transistor M10 and the reference selector 8, its description is omitted.

According to the present invention, it is possible to improve the reliability in the read operation in addition to the advantage in FIG. 13 by using another reference tunneling magnetic resistance even when a reference tunneling magnetic resistance is damaged or a proper value is not shown or in a case of further improving a read yield.

This embodiment using the plurality of reference tunneling magnetic resistances can be applied to other embodiments described in this specification. Moreover, the same advantage can be obtained.

In the present invention, the memory cell array is not restricted to the above memory cell array 2 or 2a. For example, the MRAM using a cross point cell shown in FIG. 20 can be applied to the fifth to ninth embodiments.

Figure 20:
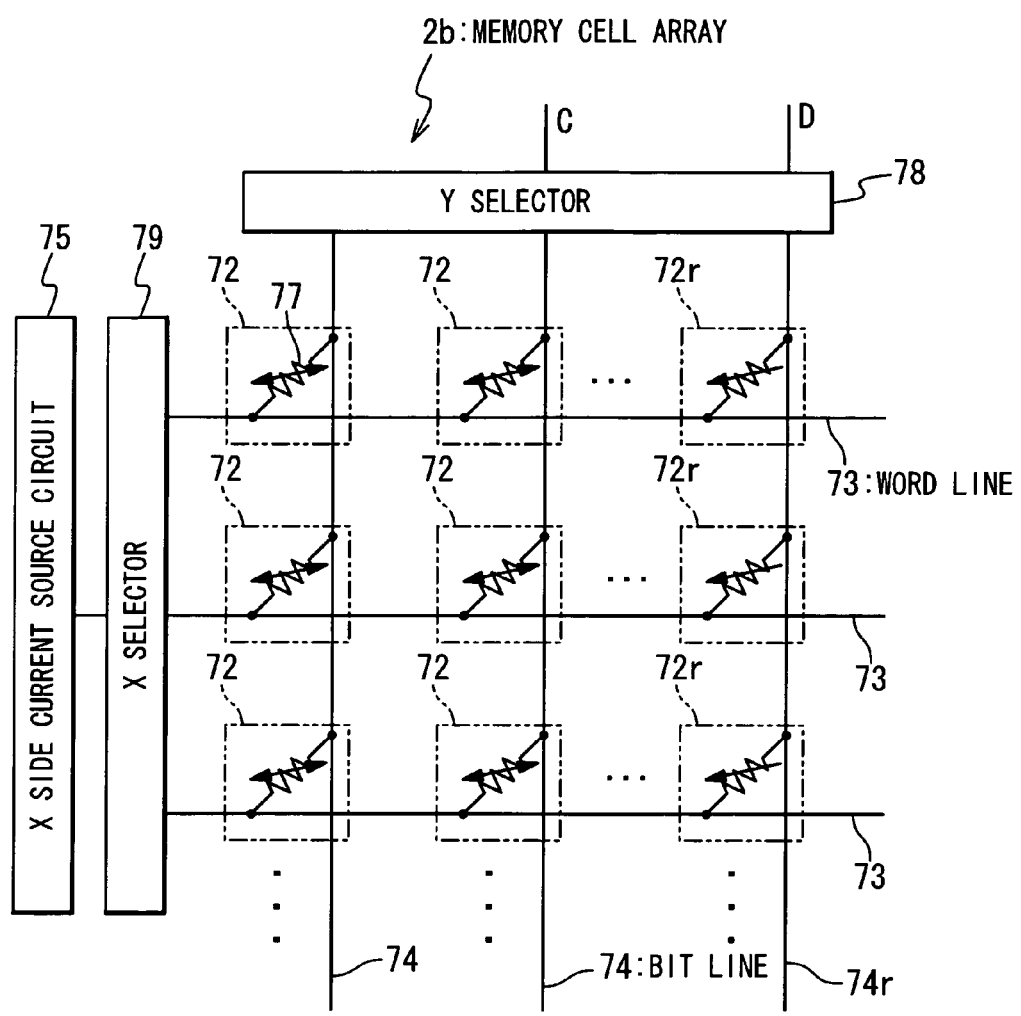
FIG. 20 is a block diagram showing a cross-point cell array.

FIG. 20 is a block diagram showing a cross point cell array 2b. The cross point cell array 2b includes a plurality of memory cells 72, a plurality of reference cells 72r, a word line 73, a bit line 74, a Y selector 78, and an X selector 79. The bit line 74 extends in the first direction (Y direction). The word line 73 extends in the second direction (X direction) substantially perpendicular to the first direction (Y direction). The Y selector 78 selects one bit line 74s of the plurality of bit lines 74 and selects one bit line 74r in the read operation. The X selector 79 selects one bit line 74s of the plurality of bit lines 74. One of the plurality of memory cells 72 is provided to each of positions where the plurality of bit lines 74 and a plurality of word lines 73 are intersected. A first tunneling magnetic resistance 77 includes the first terminal serving as one terminal connected to the word line 73 and the second terminal serving as the other terminal connected to the bit line 74. One of the plurality of reference cells 72r is provided to each of positions where the reference bit line 74r and a plurality of word lines 73 are intersected. A reference tunneling magnetic resistance 77r includes the third terminal serving as one terminal connected to the word line 73 and the fourth terminal serving as the other terminal connected to the reference bit line 74r.

In the present invention, the memory cell is not restricted to the above memory cell array 2 or 2a. For example, it is allowed to use the MRAM using two transistors and one tunneling magnetic resistance shown in FIG. 21 for the first to ninth embodiments.

Figure 21:
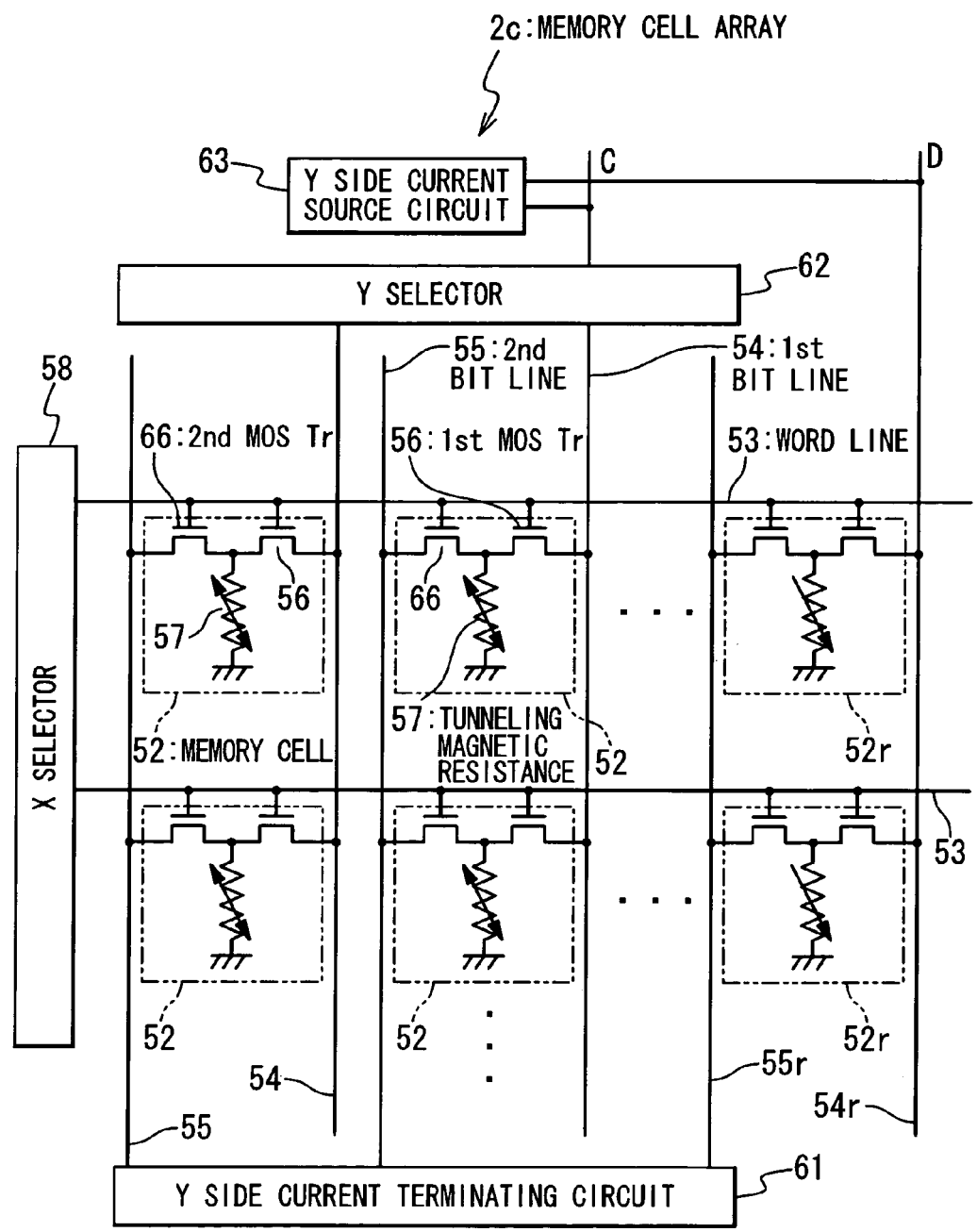
FIG. 21 is a block diagram showing another memory cell array.

FIG. 21 is a block diagram showing another memory cell array 2c.

The memory cell array 2c includes a plurality of memory cells 52, a plurality of reference cells 52r, a plurality of first bit lines 54, a plurality of second bit lines 55, a plurality of word lines 53, a Y selector 62, a Y-side current termination circuit 61, an X selector 58, and a Y-side current source circuit 63. The plurality of first bit lines 54 extend in the first direction (Y direction). The plurality of second bit lines 55 are paired with the first bit lines 54 respectively and extend in the first direction (Y direction). The plurality of word lines 53 extend in the second direction (X direction) substantially perpendicular to the first direction (Y direction). The Y selector 62 selects one bit line 54s of the plurality of first bit lines 54. The Y-side current termination circuit 61 selects one second bit line 55s of the plurality of second bit lines 55. The X selector 58 selects one word line 53s of the plurality of word lines 53. The Y-side current-source circuit 63 supplies current to a route of the second bit line 55—the tunneling magnetic resistance 57—the first bit line 54 in the write operation.

Each of the plurality of memory cells 52 includes a first tunneling magnetic resistance 57, a first transistor 56, and a second transistor 66. The first transistor 56 includes the first gate connected to the word line 53, the first terminal serving as one of terminals other than the first gate connected to the first bit line 54, and the second terminal serving as the other terminal. The second transistor 66 includes the second gate connected to the first word line 54, the fifth terminal serving as one of terminals other than the second gate connected to the second bit line 55, and the sixth terminal serving as the other terminal connected to the second terminal. Each of the plurality of memory cells 52 is provided correspondingly to one of positions where the plurality of first bit lines 54, the plurality of second bit lines 55, and the plurality of word lines 53 are intersected. The third terminal serving as one end of the first tunneling magnetic resistance 57 is connected to ground and the fourth terminal serving as the other terminal is connected to the second terminal. Each of the plurality of reference cells 52r includes a reference tunneling magnetic resistance 57r, a third transistor 56r, and a fourth transistor 66r. The third transistor 56r includes the third gate connected to the word line 53, the seventh terminal serving as one of terminals other than the third gate connected to the first bit line 54, and the eighth terminal serving as the other terminal. The fourth transistor 66r includes the fourth gate connected to the word line 53, the eleventh terminal serving as one of terminals other than the fourth gate connected to the second bit line 55, and the twelfth terminal serving as the other terminal connected to the eighth terminal. Each of the plurality of reference cells 52r is provided to one of positions where the reference first bit line 54r, a reference second bit line 55r, and the plurality of word lines 53 are intersected. The ninth terminal serving as one terminal of the reference tunneling magnetic resistance 57r is connected to ground and the tenth terminal serving as the other terminal of it is connected to the eighth terminal.

According to the present invention, it is possible to automatically set a reference voltage for determining the data stored in a memory cell to an optimal value in a semiconductor memory (MRAM) using a tunneling magnetic resistance. Thus, it is possible to improve a read liability.

Moreover, because a voltage is uniformly applied to every tunneling magnetic resistance, it is possible to set a reference voltage to an optimal value without depending on the bias dependency peculiar to a tunneling magnetic resistance.

Furthermore, it is possible to set a reference voltage to an optimal value independently of the magnitude of the resistance value or MR ratio of a tunneling magnetic resistance (TMR). Therefore, it is possible that the reference voltage can keep an optimal value and a read liability is not impaired.

Furthermore, it is possible to constitute a reference cell similarly to the memory cell in a user area and reduce the area occupied by the reference cell. Furthermore, it is possible to reduce the number of word line defects due to the short-circuit of a tunneling magnetic resistance. Furthermore, by using a tunneling magnetic resistance (TMR) for a load resistance, it is possible to decrease the area of a read circuit.

According to the present invention, it is possible to determine the data stored in the memory cell of the magnetic random access memory at a high reliability and read the data.

The invention claimed is:

1. A magnetic random access memory comprising:
a plurality of bit lines extending in a first direction;
a reference bit line extending in the first direction;
a plurality of memory cells provided along said plurality of bit lines;
a plurality of reference cells provided along said plurality of reference bit lines; and
a read section,
wherein each of said plurality of memory cells has a first tunneling magnetic resistance which has spontaneous magnetization whose direction is reversed in accordance with data to be stored to take a first state or a second state, and is connected to one of said plurality of bit lines in a read operation,
each of said plurality of reference cells has a reference tunneling magnetic resistance which has spontaneous magnetization whose direction is reversed in accordance with data to be stored to take the first state or the second state and is connected to one of said plurality of reference bit lines in the read operation,
said read section comprises:
a first resistance section having a first resistance value and having a ninth terminal serving as one terminal connected to a selected bit line and a tenth terminal serving as the other terminal connected to a first power supply in the read operation;
a second resistance section having a second resistance value different from the first resistance value and having an eleventh terminal serving as one terminal connected to said reference bit line and a twelfth terminal serving as the other terminal connected to the first power supply in the read operation; and
a comparing section configured to compare a sense voltage serving as a voltage of the ninth terminal with a reference voltage serving as a voltage of the eleventh terminal,
wherein when the data stored in a selected cell is read out, said read section generates said sense voltage by dividing the voltage of the first power supply by said first tunneling magnetic resistance and said first resistance section of the selected cell, and said reference voltage by dividing the voltage of the first power supply by said reference tunneling magnetic resistance and said second resistance section of a selected reference cell, and outputs a comparison result between said sense voltage and said reference voltage, and
said selected cell is selected from said plurality of memory cells and said selected reference cell is selected from said plurality of reference cells.

2. The magnetic random access memory according to claim 1, wherein said plurality of reference cells further include first switches respectively connected to said reference tunneling magnetic resistances in series, and said reference cells are connected in parallel with said reference bit line, and
one of said plurality of reference cells is selected by one of said first switches as a selected reference cell used in the read operation.

3. The magnetic random access memory according to claim 1, wherein there are a plurality of first resistance sections,
each of said plurality of first resistance sections is connected to the ninth and tenth terminals and has a second switch on either side of the ninth-terminal and the tenth-terminal, and
one of said plurality of first resistance sections is selected by one of said second switches as said first resistance section used in the read operation.

4. The magnetic random access memory according to claim 1, wherein there are a plurality of second resistance sections,
each of said plurality of second resistance sections is connected to the eleventh and twelfth terminals and has a third switch on either side of the eleventh-terminal and twelfth-terminal, and
one of said plurality of second resistance sections is selected by one of said third switches as said second resistance section used in the read operation.

5. The magnetic random access memory according to claim 1, wherein said reference voltage Vref is obtained from the following equation (1)

$$Vref = Vs(1) + k \cdot (Vs(2) + Vs(1)) \quad (1)$$

where said sense voltage in the first state is $Vs(1)$, and said sense voltage in the second state is $Vs(2)$ in the following equation (1), and a variable k is equal to or less than 0.49.

6. The magnetic random access memory according to claim 1, further comprising:
a plurality of word line pairs, each of which includes a first word line and a second word line extending in a second direction substantially perpendicular to the first direction;

a first selector configured to select a selected bit line from said plurality of bit lines and a reference bit line in the read operation;

a second selector configured to select a selected bit line from said plurality of bit lines in a write operation;

a third selector configured to select a selected first word line from said plurality of first word lines in the write operation; and a fourth selector configured to select a second word line from said plurality of second word lines in the read operation, wherein each of said plurality of memory cells further comprises:

a first transistor having a first gate connected to one of said plurality of second word lines, a first terminal serving as one of terminals other than the first gate, and a second terminal serving as the other terminal connected to ground, each of said plurality of memory cells is provided to one of positions where said plurality of bit lines and said plurality of word line pairs are intersected, said first tunneling magnetic resistance has a third terminal serving as one terminal connected to the first terminal and a fourth terminal serving as the other terminal connected to one of said plurality of bit lines, each of said plurality of reference cells further comprises a second transistor having a second gate connected to the second word line, a fifth terminal serving as one of terminals other than the second gate and a sixth terminal serving as the other terminal connected to ground, each of said plurality of reference cells is provided to one of positions where said plurality of reference bit lines and said plurality of word line pairs are intersected, and said reference tunneling magnetic resistance has a seventh terminal serving as one terminal connected to the fifth terminal and an eighth terminal serving as the other terminal connected to the reference bit line.

7. The magnetic random access memory according to claim 6, wherein when the data stored in a selected cell is read out, said fourth selector first supplies a voltage to a selected second word line to turn on said first transistor of said selected cell and a voltage to unselected second word lines other than said selected second word line to turn off said first transistors of unselected cells, said first selector connects said selected bit line and said reference bit line to said read section, said read section divides the voltage of the first power supply by said first tunneling magnetic resistance and said first resistance section of said selected cell to generate said sense voltage, divides the voltage of the first power supply by said reference tunneling magnetic resistance of said selected reference cell and said second resistance section to generate said reference voltage, and outputs a comparing result of said sense voltage with said reference voltage, and said selected cell is selected from said plurality of memory cells by said selected second word line and said selected bit line, said unselected cells are memory cells other than said selected cell, said selected reference cell is selected from said plurality of reference cells by said selected second word line and said reference bit line.

8. The magnetic random access memory according to claim 1, further comprises:

a word line extending in the second direction substantially perpendicular to the first direction;

a first selector configured to select said selected bit line from said plurality of bit lines and to select a reference bit line in the read operation; and a second selector configured to select a selected word line from said plurality of word lines, wherein each of said plurality of memory cells is provided to one of positions where said plurality of bit lines and said plurality of word lines are intersected, said first tunneling magnetic resistance has a first terminal serving as one terminal connected to said word line and a second terminal serving as the other terminal connected to the bit line, each of said plurality of reference cells is provided to one of positions where said reference bit line and said plurality of word lines are intersected, and said reference tunneling magnetic resistance has the third terminal serving as one terminal connected to said word line and the fourth terminal serving as the other terminal connected to said reference bit line.

9. The magnetic random access memory according to claim 1, wherein when the data stored in the selected cell is read out, said second selector applies a read voltage to a selected word line and opens unselected word lines of the plurality of word lines other than said selected word line, said first selector connects a selected bit line and a reference bit line to the read section, said read section divides the voltage of the first power supply by said first tunneling magnetic resistance and said first resistance section of a selected cell to generate a sense voltage, divides the voltage of the first power supply by said reference tunneling magnetic resistance and said second resistance section of a selected reference cell to generate a reference voltage, and outputs a comparing result of said sense voltage with said reference voltage, and said selected cell is selected from said plurality of memory cells by said selected word line and said selected bit line, and said selected reference cell is selected from said plurality of reference cells by said selected word line and said reference bit line.

10. The magnetic random access memory according to claim 1, further comprising:

a plurality of second bit lines, each of which is paired with one of said plurality of bit lines and which extend in the second direction substantially perpendicular to the first direction;

a plurality of word lines extending in the second direction substantially perpendicular to the first direction;

a first selector configured to select said selected bit line from said plurality of bit lines;

a second selector configured to select said selected second bit line from said plurality of second bit lines; and a third selector configured to select a selected word line from said plurality of word lines, wherein each of said plurality of memory cells further comprises a first transistor and a second transistor, said first transistor has a first gate connected to said word line, a first terminal serving as one of terminals other than the first gate connected to the bit line, and a second terminal serving as the other terminal, said second transistor has a second gate connected to the word line, a fifth terminal serving as one of terminals other than the second gate connected to a second bit line, and a sixth terminal serving as the other terminal connected to the second terminal, each of said plurality of memory cells is provided to one of positions where said plurality of bit lines, said plurality of second bit lines, and said plurality of word lines are intersected, said first tunneling magnetic resistance has a third terminal as one terminal connected to ground and a fourth terminal as the other terminal connected to said second terminal, each of said plurality of reference cells further comprises:

a third transistor having a third gate connected to the word line, a seventh terminal serving as one of terminals other than the third gate connected to a bit line, and an eighth terminal serving as the other terminal;

a fourth transistor has a fourth gate connected to the word line, an eleventh terminal serving as one of terminals other than the fourth gate connected to the second bit line, and a twelfth terminal serving as the other terminal connected to the eighth terminal, each of said plurality of reference cells is provided to one of positions where said reference bit line and said plurality of word lines are intersected, and said reference tunneling magnetic resistance has a ninth terminal serving as one terminal connected to ground and a tenth terminal serving as the other terminal connected to the eighth terminal.

11. The magnetic random access memory according to claim 10, wherein when the data stored in a selected cell is read out, said first selector first selects a selected bit line and opens unselected bit lines of said plurality of bit lines other than said selected bit line, said third selector supplies a voltage to said selected word line to turn on said first transistor and said second transistor of a selected cell, a voltage to unselected word lines other than said selected word line to turn off said first transistors and said second transistors of said unselected cells, said read section divides the voltage of the first power supply by said first tunneling magnetic resistance and said first resistance section of said selected cell to generate said sense voltage, the voltage of the first power supply by said reference tunneling magnetic resistance and said second resistance section of said selected reference cell to generate said reference voltage, and outputs a comparing result of said sense voltage with said reference voltage, said selected cell is selected from said plurality of memory cells by said selected work line and said selected bit line, the unselected cells are memory cells other than said selected cell, an the selected reference cell is selected from said plurality of reference cells by said selected word line and said reference bit line.

12. A magnetic random access memory comprising:

a plurality of bit lines extending in a first direction;

a reference bit line extending in the first direction;

a plurality of memory cells provided along said plurality of bit lines;

a plurality of reference cells provided along said plurality of reference bit lines; and a read section, wherein each of said plurality of memory cells has a first tunneling magnetic resistance which has spontaneous magnetization whose direction is reversed in accordance with data to be stored to take a first state or a second state, and is connected to one of said plurality of bit lines in a read operation, each of said plurality of reference cells has a reference tunneling magnetic resistance which has spontaneous magnetization whose direction is reversed in accordance with data to be stored to take the first state or the second state and is connected to one of said plurality of reference bit lines in the read operation, said read section comprises:

a first resistance section having a first resistance value and having a ninth terminal serving as one terminal connected to a selected bit line and a tenth terminal serving as the other terminal connected to a first power supply in the read operation;

a second resistance section having a second resistance value different from the first resistance value and having an eleventh terminal serving as one terminal connected to said reference bit line and a twelfth terminal serving as the other terminal connected to the first power supply in the read operation; and a comparing section configured to compare a sense voltage serving as a voltage of the ninth terminal with a reference voltage serving as a voltage of the eleventh terminal, wherein said first resistance section has a spontaneous magnetization whose direction is reversed to take the first state or the second state and has a second tunneling magnetic resistance and a third tunneling magnetic resistance connected in series, and said second resistance section has a spontaneous magnetization whose direction is reversed to take the first state or the second state and has a fourth tunneling magnetic resistance and a fifth tunneling magnetic resistance connected in series.

13. The magnetic random access memory according to claim 12, wherein said reference tunneling magnetic resistance, said first tunneling magnetic resistance, said second tunneling magnetic resistance, said third tunneling magnetic resistance, said fourth tunneling magnetic resistance, and said fifth tunneling magnetic resistance substantially have a same structure, said second tunneling magnetic resistance and said third tunneling magnetic resistance are same in the magnetization direction of the spontaneous magnetization, and said fourth tunneling magnetic resistance and said fifth tunneling magnetic resistance are different in the magnetization direction of the spontaneous magnetization.

14. A magnetic random access memory comprising:

a plurality of bit lines extending in a first direction;

a reference bit line extending in the first direction;

a plurality of memory cells provided along said plurality of bit lines;

a plurality of reference cells provided along said plurality of reference bit lines; and a read section, wherein each of said plurality of memory cells has a first tunneling magnetic resistance which has spontaneous magnetization whose direction is reversed in accordance with data to be stored to take a first state or a second state, and is connected to one of said plurality of bit lines in a read operation, each of said plurality of reference cells has a reference tunneling magnetic resistance which has spontaneous magnetization whose direction is reversed in accordance with data to be stored to take the first state or the second state and is connected to one of said plurality of reference bit lines in the read operation, said read section comprises:
a first resistance section having a first resistance value and having a ninth terminal serving as one terminal connected to a selected bit line and a tenth terminal serving as the other terminal connected to a first power supply in the read operation;
a second resistance section having a second resistance value different from the first resistance value and having an eleventh terminal serving as one terminal connected to said reference bit line and a twelfth terminal serving as the other terminal connected to the first power supply in the read operation;
a comparing section configured to compare a sense voltage serving as a voltage of the ninth terminal with a reference voltage serving as a voltage of the eleventh terminal; and
a breakdown voltage preventing circuit connected between said ninth terminal and said plurality of memory cells to prevent a voltage higher than a predetermined voltage from being applied to said plurality of memory cells.

15. A magnetic random access memory comprising:
a plurality of bit lines extending in a first direction;
a reference bit line extending in the first direction;
a plurality of memory cells provided along said plurality of bit lines;
a plurality of reference cells provided along said plurality of reference bit lines; and
a read section,
wherein each of said plurality of memory cells has a first tunneling magnetic resistance which has spontaneous magnetization whose direction is reversed in accordance with data to be stored to take a first state or a second state, and is connected to one of said plurality of bit lines in a read operation,
each of said plurality of reference cells has a reference tunneling magnetic resistance which has spontaneous magnetization whose direction is reversed in accordance with data to be stored to take the first state or the second state and is connected to one of said plurality of reference bit lines in the read operation,
said read section comprises:
a first resistance section having a first resistance value and having a ninth terminal serving as one terminal connected to a selected bit line and a tenth terminal serving as the other terminal connected to a first power supply in the read operation;
a second resistance section having a second resistance value different from the first resistance value and having an eleventh terminal serving as one terminal connected to said reference bit line and a twelfth terminal serving as the other terminal connected to the first power supply in the read operation; and
a comparing section configured to compare a sense voltage serving as a voltage of the ninth terminal with a reference voltage serving as a voltage of the eleventh terminal,
wherein said read section comprises:
a first constant voltage section configured to apply a second voltage between the ninth terminal and said plurality of memory cells and between the eleventh terminal and said plurality of reference cells;
a first current section provided between said first constant voltage section and the ninth terminal to supply said selected bit line and said first resistance section with a current having a same magnitude; and
a second current section provided between said first constant voltage section and the eleventh terminal to supply said reference bit line and said second resistance section with a current having a same magnitude.

16. The magnetic random access memory according to claim 15, wherein when the data stored in the selected cell is read out,
said first constant voltage section applies a second voltage to said selected bit line and reference bit line,
said first current section supplies sense currents having a same magnitude to said selected bit line, selected cell, and first resistance section,
said second current portion supplies reference currents having a same magnitude to said reference bit line, said selected reference cell, and said second resistance section,
said read section compares said sense voltage as a voltage between said first current section and said second resistance section with said reference voltage as a voltage between said second current section and said second resistance section and outputs a comparing result, and
said selected bit line is selected from said plurality of bit lines, said selected cell is selected from said plurality of memory cells, and said selected reference cell is selected from said plurality of reference cells.

17. The magnetic random access memory according to claim 15, wherein said first constant voltage section includes a clamp circuit.

18. The magnetic random access memory according to claim 15, wherein at least one of said first current portion and said second current portion includes a current mirror circuit.

19. The magnetic random access memory according to claim 15, wherein said read section further comprises at least one of a first auxiliary section and a second auxiliary section,
said first auxiliary section is connected to the ninth terminal and changeable said sense voltage, and
said second auxiliary section is connected to the eleventh terminal and changeable said reference voltage.

20. The magnetic random access memory according to claim 19, wherein at least one of said first auxiliary section and said second auxiliary section includes a trimming circuit.

21. A magnetic random access memory comprising:
a selected cell having a first tunneling magnetic resistance;
a selected reference cell having a reference tunneling magnetic resistance; and
a read section,
wherein said read section comprises:
a first resistance section comprising at least one tunneling magnetic resistance, having a first resistance value and connected to said selected cell in a read operation;
a second resistance section comprising at least one tunneling magnetic resistance, having a second resistance value different from said first resistance value and connected to said selected reference cell in the read operation; and
a comparing section configured to compare a sense voltage at a cell node between said first resistance section and said selected cell with a reference voltage at a reference cell node between said second resistance section and said selected reference cell and to output the comparison result.

22. The magnetic random access memory according to claim 21, wherein said first resistance section comprises second and third tunneling magnetic resistances connected in series, and
said second resistance section comprises fourth and fifth tunneling magnetic resistances connected in series.

23. The magnetic random access memory according to claim 22, wherein said first to fifth tunneling magnetic resistances and said reference tunneling magnetic resistance have a same MR ratio dependency.

24. The magnetic random access memory according to claim 22, wherein said first to fifth tunneling magnetic resistances and said reference tunneling magnetic resistance have a same temperature dependency.

25. The magnetic random access memory according to claim 22, wherein said second and third tunneling magnetic resistances store data which is different from data stored in said reference tunneling magnetic resistance.

26. The magnetic random access memory according to claim 25, wherein one of said fourth and fifth tunneling magnetic resistances stores the data which is different from the data stored in said reference tunneling magnetic resistance, and the other stores the same data as said reference tunneling magnetic resistance.

27. The magnetic random access memory according to claim 21, wherein said first and second resistance sections are connected with a first power supply.

28. The magnetic random access memory according to claim 21, further comprising:
a first current mirror circuit connected to a second power supply to operatively connect said selected cell and said first resistance section; and
a second current mirror circuit connected to the second power supply to operatively connect said selected reference cell and said second resistance section; and
a constant voltage circuit provided between said first current mirror circuit and said selected cell and between said second current mirror circuit and said selected reference cell to supply a constant voltage to said selected cell and said selected reference cell.

29. The magnetic random access memory according to claim 28, wherein said constant voltage circuit includes a clamp circuit.

30. The magnetic random access memory according to claim 28, wherein said read section further comprises:
a first auxiliary section connected in parallel to said first current mirror circuit to change said sense voltage; and
a second auxiliary section connected in parallel to said second current mirror circuit to change said reference voltage.

31. The magnetic random access memory according to claim 21, further comprising first and second groups of resistance sections,
wherein each of said resistance sections of said first group is connected to a second switch operating in response to a second control signal,
said first resistance section is one of said first group of resistance sections associated with said second control signal,
wherein each of said resistance sections of said second group is connected to a third switch operating in response to a third control signal,
said second resistance section is one of said second group of resistance sections associated with said third control signal.

32. The magnetic random access memory according to claim 21, further comprising a memory cell array,
wherein said memory cell array comprises:
a plurality of read word lines extending in a first direction;
a plurality of bit lines extending in a second direction orthogonal to said first direction;
a plurality of memory cells respectively provided at positions where said plurality of read word lines and said plurality of bit lines are intersect;
a reference bit line; and
a plurality of reference memory cells respectively provided at positions where said plurality of read word lines and said reference bit line are intersect,
said selected cell is one of said plurality of memory cells associated with a specific one of said plurality of read word lines and a specific one of said plurality of bit lines in the read operation, and
said selected reference cell is one of said plurality of reference memory cells associated with said specific read word line.

33. The magnetic random access memory according to claim 21, further comprising a memory cell array, and a reference cell circuit,
wherein said memory cell array comprises:
a plurality of read word lines extending in a first direction;
a plurality of bit lines extending in a second direction orthogonal to said first direction; and
a plurality of memory cells respectively provided at positions where said plurality of read word lines and said plurality of bit lines are intersect,
said reference cell circuit comprises:
a reference bit line; and
a plurality of reference memory cells which are provided in parallel and each of which is connected to a first switch to activate said reference memory cell in response to a first control signal,
said selected cell is one of said plurality of memory cells associated with a specific one of said plurality of read word lines and a specific one of said plurality of bit lines in the read operation, and
said selected reference cell is one of said plurality of reference memory cells associated with said first control switch.

34. The magnetic random access memory according to claim 32, wherein said memory cell array further comprises:
a plurality of write word lines respectively provided for said plurality of read word lines to extend in said first direction.

35. The magnetic random access memory according to claim 32, wherein said memory cell array further comprises:
a plurality of second bit lines respectively provided for said plurality of bit lines to extend in said second direction.

36. The magnetic random access memory according to claim 21, wherein said first tunneling magnetic resistance can take a first state and a second state, and
said reference voltage Vref is obtained from the following equation (1):

$$Vref = Vs(1) + k \cdot (Vs(2) + Vs(1)) \tag{1}$$

where said sense voltage in the first state is $Vs(1)$, and said sense voltage in the second state is $Vs(2)$ and a variable k is equal to or less than 0.49.

* * * * *